United States Patent
Kiuchi et al.

(10) Patent No.: US 11,696,411 B2
(45) Date of Patent: Jul. 4, 2023

(54) SLEEVE SOLDERING DEVICE AND METHOD OF PRODUCING ELECTRONIC DEVICE

(71) Applicant: DENSO CORPORATION, Kariya (JP)

(72) Inventors: Hayato Kiuchi, Kariya (JP); Atsushi Furumoto, Kariya (JP); Kazuyuki Hamamoto, Kariya (JP); Teruhiko Iwase, Kariya (JP); Masayuki Fujihira, Kariya (JP)

(73) Assignee: DENSO CORPORATION, Kariya (JP)

( * ) Notice: Subject to any disclaimer, the term of this patent is extended or adjusted under 35 U.S.C. 154(b) by 145 days.

(21) Appl. No.: 16/874,711

(22) Filed: May 15, 2020

(65) Prior Publication Data
US 2020/0367366 A1 Nov. 19, 2020

(30) Foreign Application Priority Data
May 16, 2019 (JP) .............................. JP2019-093025

(51) Int. Cl.
*B23K 3/00* (2006.01)
*H05K 3/34* (2006.01)
(Continued)

(52) U.S. Cl.
CPC ......... *H05K 3/3494* (2013.01); *B23K 1/0016* (2013.01); *B23K 3/0478* (2013.01);
(Continued)

(58) Field of Classification Search
CPC ............... H05K 3/3494; H05K 3/3447; H05K 2203/0405; B23K 1/0016; B23K 3/0478;
(Continued)

(56) References Cited

U.S. PATENT DOCUMENTS 4,602,144 A * 7/1986 Vogel ..................... B23K 1/018
219/230
4,932,581 A * 6/1990 Ohle ..................... B23K 3/063
228/41

(Continued)

FOREIGN PATENT DOCUMENTS

JP H04-288966 A 10/1992
JP 05200541 A * 8/1993
(Continued)

OTHER PUBLICATIONS

Machine translation of JP 2017-038007A (no date available).*

*Primary Examiner* — Kiley S Stoner
(74) *Attorney, Agent, or Firm* — Harness, Dickey & Pierce, P.L.C.

(57) ABSTRACT

A sleeve soldering device has a displacement sensor and a heat flux sensor. The displacement sensor detects a physical quantity related to a pressure from a heated sleeve heated by a heater onto an electric board when the heated sleeve presses the electric board. The displacement sensor detects a physical quantity related to a deformation amount of the electric board due to thermal energy from the heater. The heat flux sensor detects a physical quantity related to a heat transfer amount from the heater to the electric board when the heated sleeve is pressed to the electric board. A control part compares each of detection values obtained from the displacement sensor and the heat flux sensor with a respective judgment reference so as to detect whether each detection value satisfies the respective reference.

14 Claims, 13 Drawing Sheets

(51) Int. Cl.
  *B23K 1/00* (2006.01)
  *B23K 3/047* (2006.01)
  *B23K 3/03* (2006.01)
  *G05D 23/24* (2006.01)
  *B23K 101/42* (2006.01)

(52) U.S. Cl.
  CPC ............ *H05K 3/3447* (2013.01); *B23K 3/033* (2013.01); *B23K 2101/42* (2018.08); *G05D 23/24* (2013.01); *H05K 2203/0405* (2013.01)

(58) Field of Classification Search
  CPC .. B23K 3/033; B23K 2101/42; B23K 1/0004; B23K 3/06; B23K 31/125; B23K 37/053; B23K 37/00; B23K 2101/04; B23K 1/00–206; B23K 3/00–087; B23K 2101/36–42; G05D 23/24
  USPC ... 228/179.1–180.22, 102–105, 33, 41, 15.1, 228/6.2
  See application file for complete search history.

(56) References Cited

U.S. PATENT DOCUMENTS

| | | | | |
|---|---|---|---|---|
| 5,052,816 A | * | 10/1991 | Nakamura | G01N 25/72 374/5 |
| 5,232,736 A | * | 8/1993 | Tribbey | B23K 3/06 427/8 |
| 5,285,946 A | * | 2/1994 | Tomigashi | H05K 13/0409 228/9 |
| 5,485,392 A | * | 1/1996 | Frederickson | B23K 3/033 219/241 |
| 5,504,305 A | * | 4/1996 | Fischer | B23K 3/033 219/497 |
| 5,673,844 A | * | 10/1997 | Sargent | B23K 20/028 228/6.2 |
| 6,142,356 A | * | 11/2000 | Yamazaki | B23K 1/002 228/24 |
| 2001/0051840 A1 | * | 12/2001 | Sugimoto | H01R 43/0263 700/121 |
| 2002/0053591 A1 | * | 5/2002 | Razon | B23K 3/0623 228/258 |
| 2004/0035907 A1 | * | 2/2004 | Radeck | B23K 3/0607 228/41 |
| 2004/0118935 A1 | * | 6/2004 | Holm | B23K 3/0607 239/1 |
| 2007/0099412 A1 | * | 5/2007 | Miyazaki | H01L 24/81 438/612 |
| 2007/0181644 A1 | * | 8/2007 | Ueno | H01L 24/75 257/E21.511 |
| 2011/0240720 A1 | * | 10/2011 | Okada | H01L 24/799 228/264 |
| 2014/0217127 A1 | * | 8/2014 | Ikushima | H05K 3/1241 222/420 |
| 2014/0263578 A1 | * | 9/2014 | Youngquist | G06T 7/0004 228/103 |
| 2015/0008249 A1 | * | 1/2015 | Stroemberg | B23K 1/06 228/1.1 |
| 2016/0031030 A1 | * | 2/2016 | Bergstrom | B23K 3/0638 427/8 |
| 2016/0278217 A1 | * | 9/2016 | Tanaka | H05K 3/3468 |
| 2016/0278251 A1 | * | 9/2016 | Tanaka | H05K 13/0061 |
| 2016/0279725 A1 | * | 9/2016 | Azdasht | B23K 26/354 |
| 2016/0343626 A1 | * | 11/2016 | Colosimo, Jr. | B23K 1/0016 |
| 2018/0021803 A1 | * | 1/2018 | Nauchi | B05C 5/00 427/58 |
| 2020/0038902 A1 | * | 2/2020 | Bergstrom | H05K 3/1241 |

FOREIGN PATENT DOCUMENTS

| | | | | |
|---|---|---|---|---|
| JP | H10-303546 A | | 11/1998 | |
| JP | 2001036232 A | * | 2/2001 | ........... H01L 21/681 |
| JP | 2002-164142 A | | 6/2002 | |
| JP | 2003-019589 A | | 1/2003 | |
| JP | 2010-251447 A | | 11/2010 | |
| JP | 2016-184760 A | | 10/2016 | |
| JP | 2017-005235 A | | 1/2017 | |
| JP | 2017038007 A | * | 2/2017 | |
| JP | 2018-069288 A | | 5/2018 | |
| JP | 6512659 B2 | * | 5/2019 | |
| JP | 2020-040085 A | | 3/2020 | |
| JP | 2020-040086 A | | 3/2020 | |

\* cited by examiner

SLEEVE SOLDERING DEVICE AND METHOD OF PRODUCING ELECTRONIC DEVICE

CROSS-REFERENCE TO RELATED APPLICATION

This application is related to and claims priority from Japanese Patent Application No. 2019-093025 filed on May 16, 2019, the contents of which are hereby incorporated by reference.

TECHNICAL FIELD

The present disclosure relates to sleeve soldering devices and methods of producing electronic devices.

BACKGROUND

There is a sleeve soldering device which performs a soldering process in which a terminal of an electronic component and a terminal of an electric board are joined together by using a sleeve. Such a sleeve has a cylindrical pipe shape through which a filler metal, i.e. solder is passed. This sleeve is a trowel for providing thermal energy to the electric board and a solder. The thermal energy from the heated sleeve is supplied to the electric board, on which an electronic component is mounted, while the sleeve is in contact with the electric board. This provides a necessary amount of thermal energy to the terminal of the electronic component and the terminal of the electric board. A solder is fed into the sleeve of a cylindrical pipe shape. The fed solder is heated and melted by thermal energy from the sleeve, and the melted solder is fed into a soldering part between the terminal of the electronic component and the terminal of the electric board. When the solder is hardened, the soldering process between terminal of the electronic component and the terminal of the electric board is completed.

The sleeve soldering device has a benefit feature for performing the soldering process at a narrow gap in the electric board when compared with the use of a soldering device composed of different components, one for feeding a solder to a soldering target part and the other for heating thermal energy to the target part. In addition, the sleeve soldering device does not allow solder to spread because a solder is melted inside the sleeve.

In the soldering process by the sleeve soldering device, the heated sleeve is pressed at a soldering target on the electric board with a predetermined pressure. This supplies a necessary thermal energy to the soldering target, and spreads the melted solder onto a surface of the terminal of the electronic component and a surface of the terminal of the electric board. However, when a pressure applied to the sleeve is reduced and/or a contact area between the sleeve and the electric board is reduced, this reduces a total amount of thermal energy supplied to the soldering area in the electric board, and the soldering area does not have a necessary amount of thermal energy. This prevents the melted solder from being adequately spread on the surface of the terminal of the electronic component and the surface of the terminal of the electric board. As a result, this avoids a good contact between the surface of the terminal of the electronic component and the surface of the terminal of the electric board, and produces a defective product due to this incorrect soldering.

Substrate warpage may occur due to the supply of excess thermal energy onto the electric board. The soldering process is performed during occurrence of the substrate warpage. After the completion of the soldering process, the electric board is returned to the condition before the soldering process. This causes a residual stress in the solder on the electric board after the soldering process, and the residual stress may produce defective products after the completion of the soldering process. Accordingly, it is necessary to monitor the soldering process so as to diagnose whether a correct soldering process is performed.

SUMMARY

It is desired for the present disclosure to provide a sleeve soldering device which performs a soldering process of a terminal of an electronic component and a terminal of an electric board. The sleeve soldering device has a sleeve, a heater, a movement mechanism, a detection part and a judgment part. The sleeve has a through hole through which a solder is passed and fed. The sleeve provides thermal energy when being in contact with the electric board. The sleeve feeds the solder to the soldering part between the terminal of the electronic component and the terminal of the electric board. The heater generates thermal energy and heats the sleeve using the generated thermal energy. The movement mechanism moves the heated sleeve when the sleeve is in contact with and pressed to the electric board. The detection part detects at least one of a physical quantity related to a pressure from the sleeve to the electric board when the sleeve presses the electric board, a physical quantity related to a heat transfer amount of thermal energy generated by the heater supplied to the electric board when the sleeve presses the electric board, and a physical quantity related to a deformation amount of the electric board due to the thermal energy generated by the heater. The judgment part compares the detection value of the physical quantity detected by the detection part with the predetermined judgment reference, and detects whether the detection value satisfies the predetermined judgment reference on the basis of the comparison result.

BRIEF DESCRIPTION OF THE DRAWINGS

A preferred, non-limiting embodiment of the present disclosure will be described by way of example with reference to the accompanying drawings, in which.

DETAILED DESCRIPTION OF THE PREFERRED EMBODIMENTS

Figure 1A:
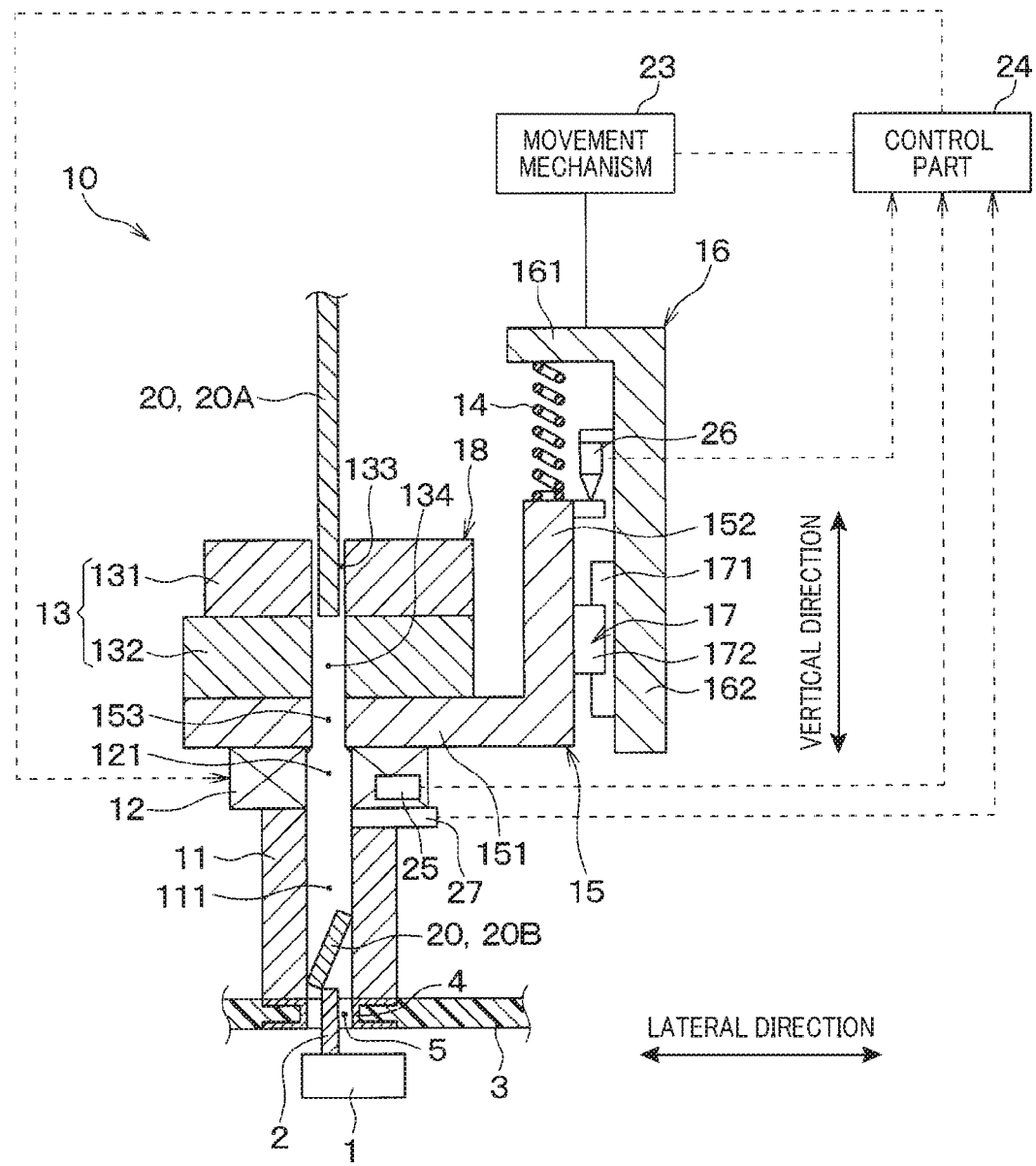
FIG. 1A is a view showing a schematic structure of a sleeve soldering device according to an exemplary embodiment of the present disclosure.

Hereinafter, various embodiments of the present disclosure will be described with reference to the accompanying drawings. In the following description of the various embodiments, like reference characters or numerals designate like or equivalent component parts throughout the several diagrams.

Exemplary Embodiment

A description will be given of a sleeve soldering device and a method of producing an electronic device by using the sleeve soldering device according to an exemplary embodiment of the present disclosure with reference to FIG. 1A and FIG. 1B to FIG. 15.

FIG. 1A is a view showing a schematic structure of the sleeve soldering device 10 according to the exemplary embodiment. As shown in FIG. 1A, the sleeve soldering device 10 uses a sleeve 11 and performs a soldering process for joining a terminal 2 of an electronic component 1, and a terminal 4 of an electric board 3. In general, each of terminal 2 of the electronic component 1 and the terminal 4 of the electric board 3 is an electrode through which another component is electrically connected. For example, the terminal 2 of the electronic component 1 is a lead made of metal wire. On the other hand, the terminal 4 of the electric board 3 is a conductive layer formed around a through hole 5 and formed on an inner wall surface of the through hole 5. The through hole 5 penetrates the electric board 3. It is acceptable for the conductive layer to be formed on the inner wall surface of the through hole 5 only.

The sleeve soldering device 10 performs the soldering process to am join the terminal 2 of the electronic component 1 and the terminal 4 of the electric board 3 together while the terminal 2 of the electronic component 1 has been inserted into the through hole 5. It is acceptable for the terminal 2 of the electronic component 1 and the lead to have a different shape. It is acceptable for the terminal 4 of the electric board 3 to have a shape which is different from the shape shown in FIG. 1A, and FIG. 2A to FIG. 2D.

The sleeve soldering device 10 has the sleeve 11, a heater 12, a cutter 13, a spring 14, a connection member 15, a supporting member 16, and a linear guide 17.

The sleeve 11 has a cylindrical shape. A through hole 111 is formed in the sleeve 11. A solder 20 is inserted into the through hole 111. When the heater 12 heats the sleeve 11, the solder 20 is melted inside the sleeve 11. The sleeve 11 heats the electric board 3 when the sleeve 11 is in contact with the electric board 3. The sleeve 11 is made of ceramics.

The heater 12 heats the sleeve 12. The heater 12 is arranged at the upper side of the sleeve 11. The solder 20 is passed through a through hole 121 of the heater 12. The through hole 121 of the heater 12 communicated with the through hole 111 of the sleeve 11. It is acceptable for the heater 12 to be wound on the outer surface of the sleeve 11.

The cutter 13 cuts the solder 20. The solder 20 is a thread solder 20A. The thread solder 20A is cut into a piece as the solder 20. The cutter 13 has an upper blade and a lower blade. The upper blade 131 is arranged on the lower blade 132.

The upper blade 131 has a through hole 133 through which the solder is passed. A through hole 134 of the lower blade 132 communicates with the through hole 111 of the sleeve 11 through the through hole 121 of the heater 12.

The lower blade 132 is fixed. On the other hand, the upper blade 131 moves in a lateral direction to cut the thread solder 20A into a solder piece 20B (20) at a position between the through hole 133 of the upper blade 131 and the through hole 134 of the lower blade 132.

The solder piece 20B is a cut piece and supplied to the through hole 111 of the sleeve 11.

An assembly structure 18 having the sleeve 11 is suspended by the spring 14. In the sleeve soldering device 10 according to the exemplary embodiment, the assembly structure 18 has the sleeve 11, the heater 12, and the cutter 13.

The connection member 15 connects the assembly structure 18 with the spring 14. The connection member 15 has a first connection part 151 and a second connection part 152. The first connection part 151 is connected to the assembly structure 8 in the connection member 15, The first connection part 151 is extended toward the lateral direction. The first connection part 151 is arranged between the heater 12 and the cutter 13. The first connection part 151 forms a chamber 153 through which the solder is passed.

The second connection part 152 is connected to the spring 14 in the connection member 15. The second connection part 152 is extended in a vertical direction. The second connection part 152 is extended from one end of the first connection part 151. The upper side of the second connection part 152 is connected to the lower side of the spring 14.

The supporting member 16 supports the assembly structure 18 through the spring 14. The supporting member 16 has a first supporting to member 161 and a second supporting member 162. The first supporting member 161 in the supporting member 16 is connected to the upper side of the spring 14. The first supporting member 161 is extended toward the lateral direction.

The second supporting member 162 is connected to the first supporting member 161 in the supporting member 16. The second supporting member 162 is extended toward the vertical direction. Specifically, the second supporting member 162 is extended toward the electric board 3 side in the vertical direction from the end of the first supporting member 161.

The linear guide 17 guides the second connection part 152 in the vertical direction. The linear guide 17 has a fixed part 171 and a movement part 172. The fixed part 171 is supported by the second supporting member 162. The movement part 172 moves in the vertical direction while vibrating, and the fixed part 171 does not move and is fixed. The movement part 172 is arranged in the second connection part 152. The linear guide 17 allows the sleeve 11 to move in the vertical direction.

The sleeve soldering device 10 is equipped with a movement mechanism 23, a control part 24 and a temperature sensor 25. The movement mechanism 23 moves the supporting member 16. The supporting member 16 moves the sleeve 11. That is, the movement mechanism 23 moves the sleeve 11 while the assembly structure 18 having the sleeve 11 is suspended, i.e. supported by the spring 14. For example, a transfer robot is used as the movement mechanism 23.

The control part 24 performs the control of behavior of the heater 12, the cutter 13 and the movement mechanism 23. The control part 24 is a computer system composed of a known microcomputer, a memory, and peripheral circuits. The memory is composed of a non-transitory computer readable storage medium for storing a program.

The temperature sensor 25 detects a temperature of the heater 12. The temperature sensor 25 transmits its detection result to the control part 24. When receiving the detection result of the temperature sensor 25, the control part 24 adjusts thermal energy from the heater 12 so that the temperature of the heater 12 reaches a target temperature.

The sleeve soldering device 10 according to the exemplary embodiment has a displacement sensor 26. The displacement sensor 26 detects a displacement amount of a length of the spring 14. Specifically, the displacement sensor 26 detects a compressed amount of the spring 14 from a reference length of the spring 14.

The spring 14 has its reference length when the spring 14 supports the assembly structure 18 and the sleeve 11 is not in contact with the electric board 3. In other words, the reference length of the spring 14 indicates the length of the spring 14 when the spring 14 supports the assembly structure 18 only.

When the supporting member 16 is lowered from a state in which the sleeve 11 is in contact with the electric board 3, the sleeve 11 presses the electric board 3 while the assembly structure 18 is suspended by the spring 14. A reaction force generated by the extended spring 14 is supplied to the assembly structure 18. The sleeve 11 is pressed to the electric board 3 by the pressure corresponding to a difference between a force of the weight of the assembly structure 18 and the reaction force of the spring 14.

The extended spring 14 is compressed due to the down movement of the supporting member 16. The compression of the spring 14 reduces its reaction force. This increases a magnitude of the pressure from the sleeve 11 to the electric board 3. The magnitude of the pressure from the sleeve 11 to the electric board 3 changes due to the change of the length of the spring 14. The displacement amount of the spring 14 corresponds to a physical quantity related to the pressure from the sleeve 11 to the electric board 3. Accordingly, the displacement sensor 26 corresponds to a detection part for detecting a physical quantity related to the pressure from the sleeve 11 to the electric board 3.

In a state in which the sleeve 11 is in contact with the electric board 3, when the electric board 3 is deformed by thermal energy generated by the heater 12, the sleeve 11 which is in contact with the electric board 3 moves in the vertical direction according to the displacement amount of the electric board 3. As shown in FIG. 1A, the vertical direction corresponds to an axial direction of the sleeve 11.

The movement of the sleeve 11 along the vertical direction changes the length of the spring 14. Accordingly, the change amount of the length of the spring 14 corresponds to as a physical quantity a deformation amount of the electric board 3 due to thermal energy generated by the heater 12.

For this reason, the displacement sensor 26 corresponds to the detection part for detecting a physical quantity related to the deformation amount of the electric board 3 caused by thermal energy generated by the heater 12.

In the structure of the sleeve soldering device 10 according to the exemplary embodiment, the displacement sensor 26 detects a change amount in length of the spring 14, and detects a displacement amount in the vertical direction of the sleeve 11 as the physical quantity related to the deformation amount of the electric board 3 due to thermal energy generated by the heater 12.

The upper side of the displacement sensor 26 is supported by the second supporting member 162. The lower side of the displacement sensor 26 is in contact with a part of the second connection part 152.

The displacement sensor 26 detects a displacement amount of the second connection part 152 in the vertical direction, and detects a change amount of the spring on the basis of the detected displacement amount of the second connection part 152.

It is possible to use a differential transformer type sensor as the displacement sensor 26. It is acceptable to use another type sensor as the displacement sensor 26.

The displacement sensor 26 transmits the detection result to the control part 24. When receiving the detection result of the displacement sensor 26, the control part 24 stores the received data into the memory in the control part 24.

The sleeve soldering device 10 according to the exemplary embodiment is equipped with a heat flux sensor 27. The heat flux sensor 27 detects an amount of heat flux, hereinafter, referred to also as the heat flux amount, from the heater 12 to the electric board 3 through the sleeve 11. The heat flux amount represents a physical quantity related to a heat transfer amount from the heater 12 to the electric board 3 through the sleeve 11. The heat flux sensor 27 corresponds to a detection part for detecting a physical quantity related to heat transfer amount from the heater 12 to the electric board 3 through the sleeve 11.

As shown in FIG. 1A, the heat flux sensor 27 is arranged between the heater 12 and the sleeve 11. It is possible to arrange the heat flux sensor 27 on the surface of the heater 12, the surface of the sleeve 11, etc. It is possible to be arrange the heat flux sensor 27 at a location which allows the heat flux sensor 27 to detect an amount of the heat flux from the heater 12 to the electric board 3 through the sleeve 11.

The heat flux sensor 27 transmits the detection result to the control part 24. When receiving the detection result of the heat flux sensor 27, the control part 24 stores the received data into the memory in the control part 24.

A description will now be given of the method of producing an electronic device composed of the electronic component 1 and the electric board 3. The sleeve soldering device 10 according to the exemplary embodiment performs the method in which the sleeve soldering device 10 performs a soldering process of soldering the terminal 2 of the electronic component 1 and the terminal 4 of the electric board 3 together.

In the method, the electric board 3 on which the electronic component 1 has been assembled is arranged at a predetermined location so as for the sleeve soldering device 10 to perform the soldering process. In the assembled state represents the state in which the terminal 2 of the electronic component 1 has been inserted into the through hole 5.

Figure 1B:
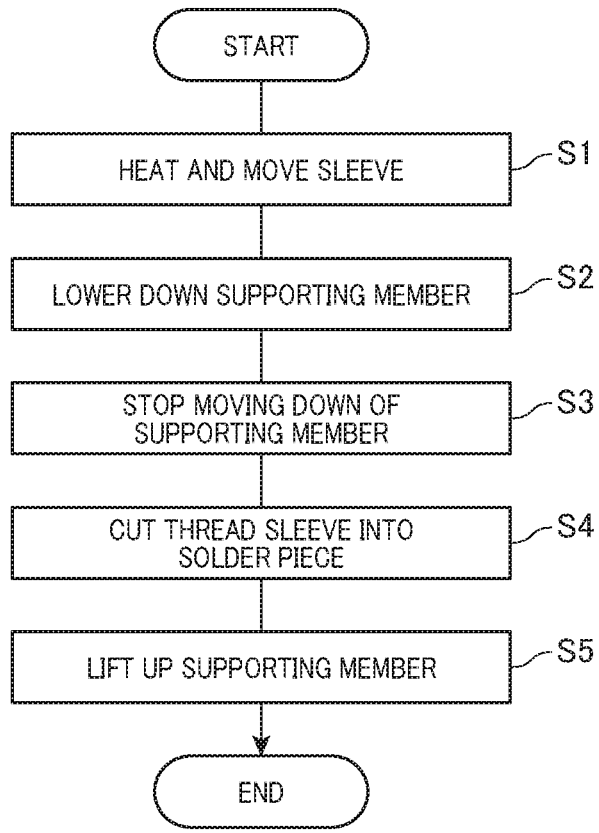
FIG. 1B is a view showing a flow chart for controlling a soldering process performed by a control part in the sleeve soldering device according to the exemplary embodiment.

FIG. 1B is a view showing a flow chart for controlling a soldering process performed by the control part 24 in the sleeve soldering device 10 according to the exemplary embodiment.

The control part 24 performs the soldering process shown in FIG. 1B so as to solder the terminal 2 of the electronic component 1 and the terminal 4 of the electric board 3 together.

In step S1 shown in FIG. 1B, the control part 24 instructs the heater 12 to generate thermal energy so as to heat the sleeve 11. The control part 24 instructs the movement mechanism 23 to move the sleeve 11. Specifically, the control part 24 instructs the heater 12 to generate thermal energy. The sleeve 11 is heated by the thermal energy generated by the heater 12. The control part 24 instructs the movement mechanism 23 to move the supporting member 16 so that the sleeve 11 is moved to a reference position in the sleeve soldering device 10. This process allows the sleeve 11 heated by the heater 12 to be moved and reach the reference position of the sleeve soldering device 10.

The reference position in the sleeve soldering device 10 is a position which has been determined in a height direction of the electric board 3 and on the surface of the electric board 3. In the structure of the sleeve soldering device 10 according to the exemplary embodiment, the height direction of the electric board 3 corresponds to the vertical direction shown in FIG. 1A, and corresponds to the vertical direction along which the sleeve soldering device 10 moves.

A direction along the surface of the electric board 3 is perpendicular to the vertical direction of the sleeve soldering device 10. The reference position in the height direction of the electric board 3 corresponds to the position at which the front end of the sleeve 11 is in contact with the surface of the electric board 3. Further, the reference position in the direction along the surface of the electric board 3 is equal to the central axis O of the terminal 2 of the electronic component 1.

The operation flow progresses to step S2. In step S2, the control part 24 instructs the movement mechanism 23 to start the supporting to member 16 to be down in the vertical direction. This moves the supporting member 16 down.

The operation flow progresses to step S3. In step S3, the control part 24 instructs the movement mechanism 23 to stop the movement of the supporting member 16. Specifically, the control part 24 instructs the movement mechanism 23 to stop the supporting member 16 to arrange the sleeve 11 at a position when the sleeve 11 provides a predetermined pressing force to the electric board 3. This position allows the sleeve 11 to press the electric board 3 during a predetermined period of time by the predetermined pressing force toward the vertical direction. During the predetermined period of time, the sleeve 11 provides thermal energy to the electric board 3, the terminal 2 of the electronic component 1 and the terminal 4 of the electric board 3. That is, the electric board 3, the terminal 2 of the electronic component 1 and the terminal 4 of the electric board 3 are heated by the thermal energy supplied from the sleeve 11. The operation flow progresses to step S4.

Figure 2A:
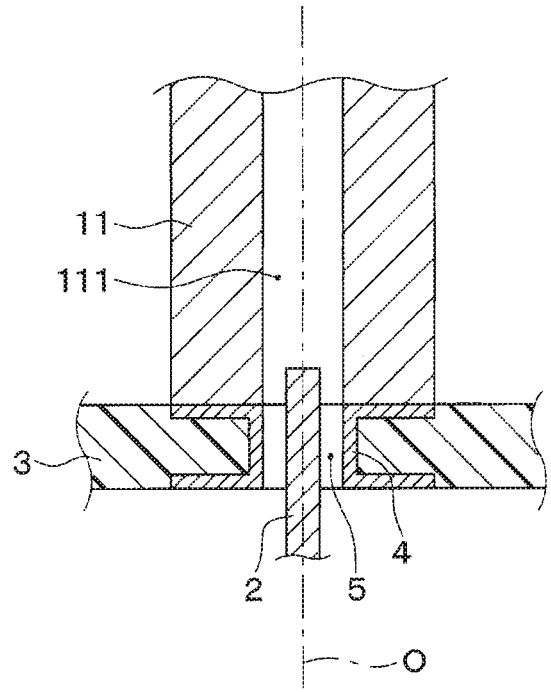
FIG. 2A to FIG. 2C are views showing cross sections of a sleeve, a terminal of an electric board and a terminal of an electronic component during the soldering process when the soldering process is correctly performed by the sleeve soldering device according to the exemplary embodiment.
Figure 2B:
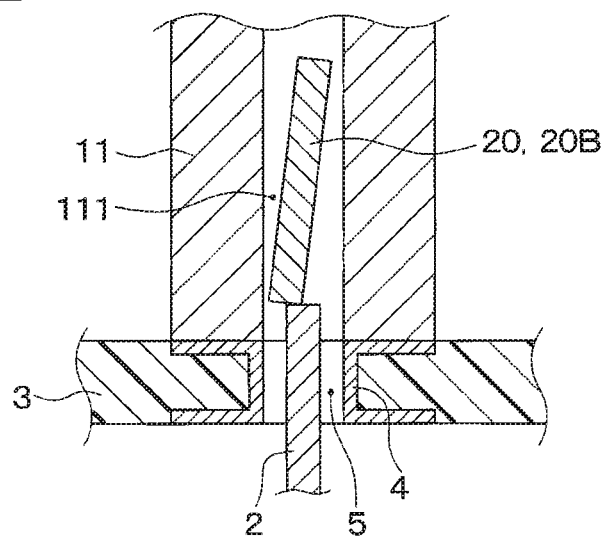
Figure 2C:
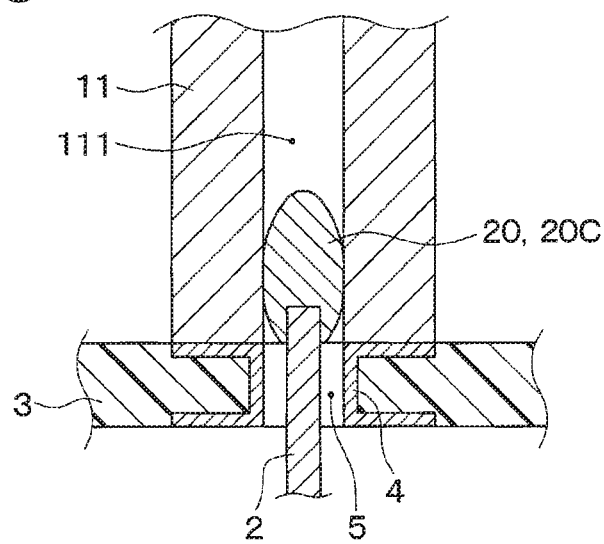

FIG. 2A to FIG. 2C are views showing cross sections of the sleeve 11, the terminal 4 of the electric board 3 and the terminal 2 of the electronic component 1 during the soldering process when the soldering process is correctly performed by the sleeve soldering device 10 according to the exemplary embodiment.

In step S4, the control part 24 instructs the cutter 13 to cut the thread solder 20A. Specifically, the control part 24 feeds the thread solder 20A into the through hole 133 of the upper blade 131 and the through hole 134 of the lower blade 132. The control part 24 instructs the upper blade 131 to move. This movement of the upper blade 131 cuts the thread solder 20A into a piece as the solder piece 20B. As am shown in FIG. 2B, the solder piece 20B is supplied into the through hole 111 of the sleeve 11.

The solder piece 20B in the through hole 111 of the sleeve 11 is heated and melt by the thermal energy from the sleeve 11. This provides a melted solder 20C in the through hole 111 of the sleeve 11. The melted solder 20C spread on the terminal 2 of the electronic component 1 and the terminal 4 of the electric board 3. The operation progresses to step S5.

In step S5, the control part 24 instructs the movement mechanism 23 to lift up the supporting member 16. This allows the sleeve 11 to separate from the electric board 3. The melted solder 20C is cooled and solidified.

Figure 2D:
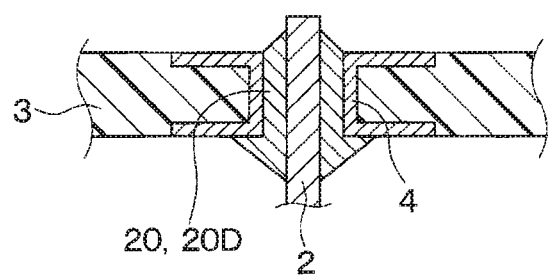
FIG. 2D is a view showing a cross section of the sleeve, the terminal of the electric board and the terminal of the electronic component when the soldering process has been correctly completed.

FIG. 2D is a view showing a cross section of the sleeve 11, the terminal 2 of the electric board 1 and the terminal 4 of the electronic component 3 when the soldering process has been correctly completed.

As shown in FIG. 2D, a solder fillet 20D is formed between the terminal 2 of the electronic component 1 and the terminal 4 of the electric board 3. The solder fillet 20D is the solidified solder of the melt solder 20C. The solder fillet 20D has a mountain shape. The terminal 2 of the electronic component 1 joins to the terminal 4 of the electric board 3 through the solder fillet 20D.

After the completion of the soldering process shown in FIG. 1B, an inspection process, other processes are performed so as to produce as a final product the electronic device having the electronic component 1 and the electric board 3.

When the sleeve soldering device 10 according to the exemplary embodiment performs the soldering process, the control part 24 performs the control of adjusting the overall behavior of the components forming the structure of the sleeve soldering device 10 in order to perform a correct soldering of bonding the terminal 2 of the electronic component 1 and the terminal 4 of the electric board 3 together on the basis of the detection results of the displacement sensor 26 and the thermal flow sensor 27. When the detection result indicates an incorrect soldering process, the control part 24 stops the soldering process.

A description will now be given of the behavior of the control part 24. A correct soldering process and an incorrect soldering process provide a different detection result of the displacement sensor 26 and the thermal flow sensor 27.

When the sleeve soldering device 10 performs the correct soldering process, the sleeve 11 is in contact with the electric board 3 at a time when the heated sleeve 11 reaches its reference position. The movement mechanism 23 moves the supporting member 16 to a position of a predetermined distance measured from the reference position in the sleeve soldering device 10 while the sleeve 11 presses the electric board 3 with a predetermined pressure.

As previously described, because the movement mechanism 23 moves down, i.e. lower down the supporting member 16 while the sleeve 11 is in contact with the electric board 3, the spring 14 is compressed.

The time when the down movement of the supporting member 16 is finished is equal to the time when the pressing of the sleeve 11 to the electric board 3 is completed.

The pressing force of the sleeve 11 to the electric board 3 reaches a predetermined pressure at the time when the pressing of the sleeve 11 to the electric board 3 is completed. The position of the supporting member 16 is maintained.

Figure 3:
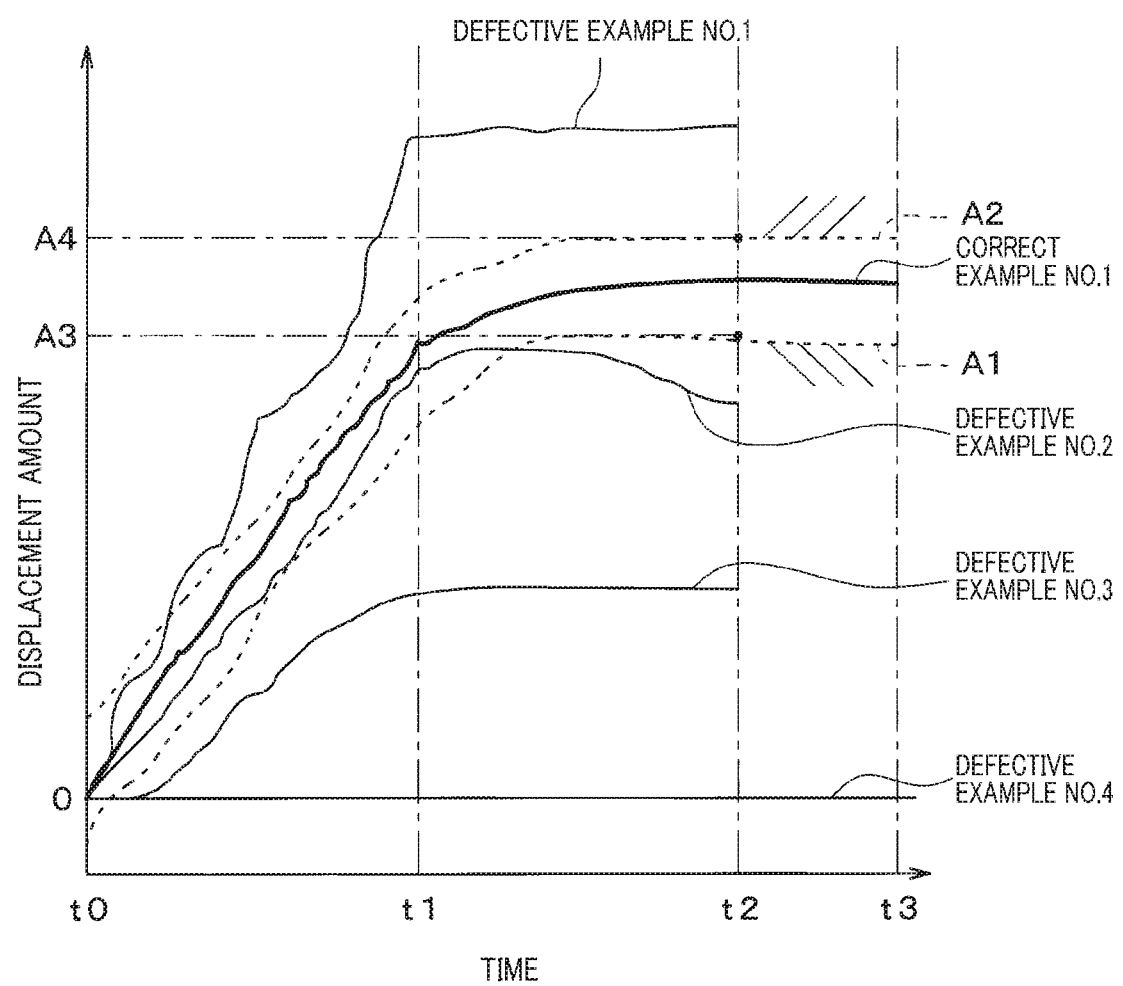
FIG. 3 is a graph showing a relationship between a displacement amount detected by a displacement sensor and a time elapse during the soldering process performed by the sleeve soldering device according to the exemplary embodiment.

FIG. 3 is a graph showing a relationship between a displacement amount detected by a displacement sensor 26 and a time elapse during the soldering process performed by the sleeve soldering device 10 according to the exemplary embodiment;

As previously described, when the sleeve soldering device 10 performs the correct soldering process, the detection result of the displacement sensor 26 varies along the line of the example OK1 designated by the solid curve shown in FIG. 3.

The displacement amount along the vertical axis shown in FIG. 3 corresponds to the displacement amount detected by the displacement sensor 26, and corresponds to the compression amount of the spring 14 measured from the reference length of the spring 14.

The lateral axis shown in FIG. 3 represents the time elapse measured from the time when the sleeve 11 reaches the reference position.

In the correct example No. 1 shown in FIG. 3, the displacement amount gradually increases according to the elapse of time during a period counted from the time t0 to the time U. At the time to, the sleeve 11 reaches the reference position in the sleeve soldering device 10. At the time t1, the pressing process of the sleeve 11 to the electric board 3 is completed.

During a period counted from the time t1 to the time t3 through the time t2 shown in FIG. 3, the displacement amount becomes constant. At the time t2 when the thread solder 20A is fed, the solder piece 20B cut from the solder 20 is supplied into the through hole 111 of the sleeve 11. At the time t3, the sleeve 11 is withdrawn or separates from the electric board 3.

Figure 4:
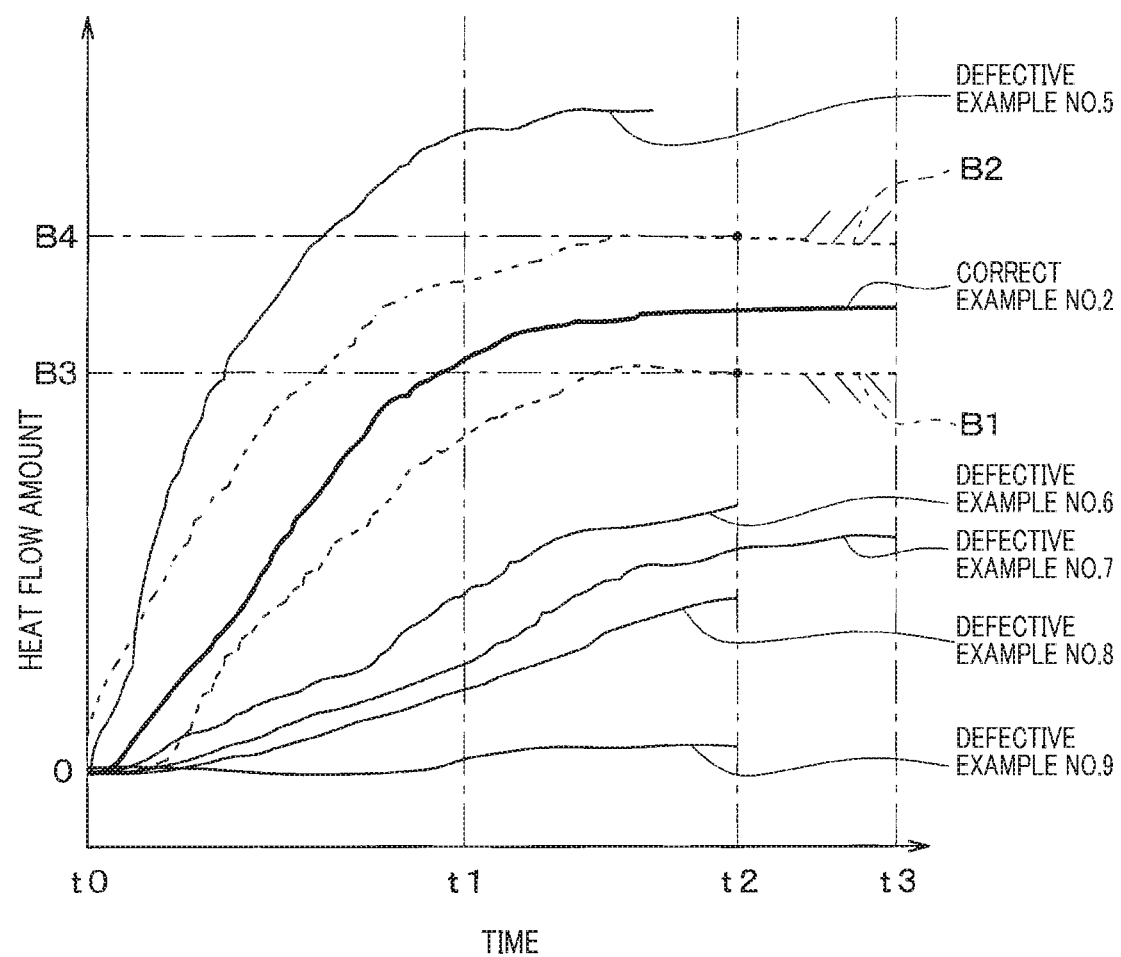
FIG. 4 is a graph showing a relationship between a heat flux amount detected by a heat flux sensor and a time elapse during the soldering process performed by the sleeve soldering device according to the exemplary embodiment.

FIG. 4 is a graph showing a relationship between a heat flux amount detected by the heat flux sensor 27 and a time elapse during the soldering process performed by the sleeve soldering device according to the exemplary embodiment.

For example, the heat flux sensor 27 detects a heat flux amount designated by the correct example No. 2 shown in FIG. 4.

In the correct example No2. shown in FIG. 4, the heat flux amount detected by the heat flux sensor 27 gradually increases according to the elapse of time.

FIG. 5 to FIG. 10, and FIG. 11A to FIG. 11C are views, each showing a cross section of the sleeve 11, the terminal 4 of the electric board 3 and the terminal 2 of the electronic component 1 during various incorrect soldering processes.

Figure 5:
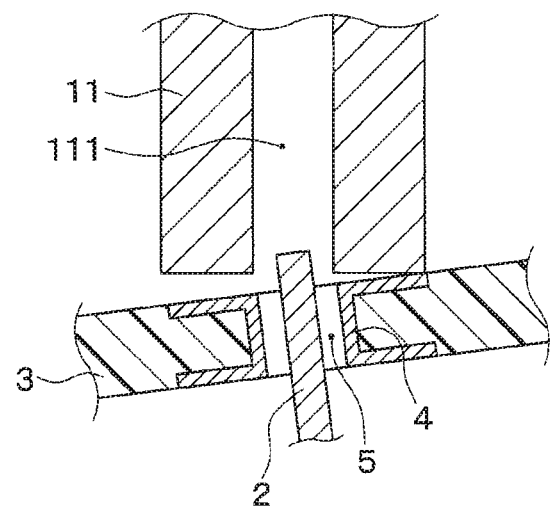
FIG. 5 to FIG. 10, and FIG. 11A to FIG. 11C are views, each showing a cross section of the sleeve, the terminal of the electric board and the terminal of the electronic component during an incorrect soldering process.
Figure 6:
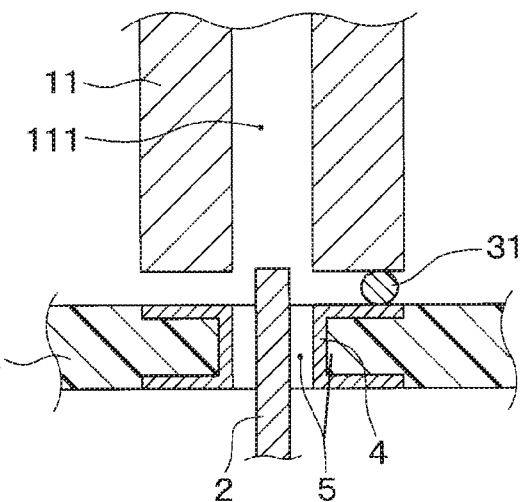
Figure 7:
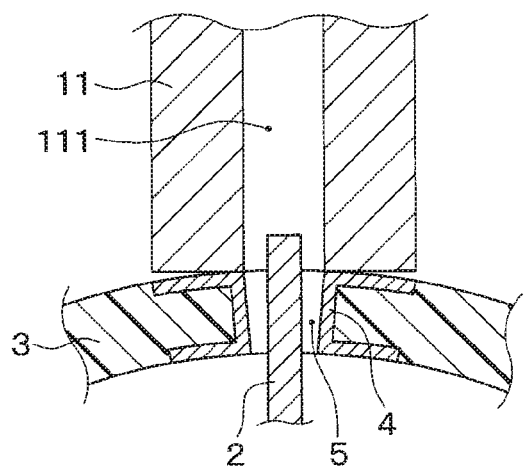

That is, there are several examples regarding an incorrect arrangement of the sleeve 11 and the electric board 3 shown in FIG. 5 to FIG. 10, and FIG. 11A to FIG. 11C, FIG. 5 shows an example of an incorrect arrangement in which the electric board 3 is tilted to the sleeve 11. FIG. 6 shows another example of an incorrect arrangement in which an obstacle 31 is arranged between the sleeve 11 and the electric board 3. FIG. 7 shows another example of an incorrect arrangement in which the electric board 3 is warped.

As shown in FIG. 5, the surface direction on the electric board 3 is tilted to a direction which is perpendicular to the axial direction of the sleeve 11. Variation in dimension of a component and a chuck causes the tilted state of the electric board 3 shown in FIG. 5.

The obstacle 31 shown in FIG. 6 is accidentally inserted between the sleeve 11 and the electric board 3 during a manufacturing process. As shown in FIG. 7, the electric board 3 is warped upward due to some reason before the heating process through the sleeve 11.

Each of the examples as shown in FIG. 5 to FIG. 7 reduces a contact area between the sleeve 11 and the electric board 3. This cannot supply necessary thermal energy to a contact point between the terminal 2 of the electronic component 1 and the terminal 4 of the electric board 3. That is, this prevents the melted solder 20C from being adequately dispersed on the overall surfaces of the terminal 2 of the electronic component 1 and the terminal 4 of the electric board 3. This prevents the terminal 2 of the electronic component 1 and the terminal 4 of the electric board 3 from being closely joined together. As a result, those cases shown in FIG. 5 to FIG. 7 produce final products having a solder defect.

In each of the examples labelled as defective examples of the electric board 3, which is tilted shown in FIG. 5, an obstacle 31 is present between the sleeve 11 and the electric board 3 shown in FIG. 6, the electric board 3 is warped upward as shown in FIG. 7, the sleeve 11 presses the electric board 3 at a position which is higher in the vertical direction than the reference position when the sleeve 11 is moved to the reference position. The supporting member 16 is moved down to a pressure completion position when the pressing of the sleeve 11 to the electric board 3 is completed. The compression amount of the spring 14 increases when compared with the compression amount of the spring 14 when the correct soldering process.

Accordingly, the detection result of the displacement sensor 26 detects is varied along the defective example No. 1 shown in FIG. 1 when the electric board 3 is tilted shown in FIG. 5, the obstacle 31 is present between the sleeve 11 and the electric board 3 shown in FIG. 6, and the electric board 3 is warped upward shown in FIG. 7.

As previously described, the sleeve 11 reaches the reference position in the sleeve soldering device 10 at the time t0. The thread solder 20A is fed at the time t2.

During the period counted from the time t0 to the time t2, the displacement amount detected by the displacement sensor 26 in the defective example No. 1 is greater than the displacement amount in the correct example No. 1.

When the electric board 3 is tilted shown in FIG. 5, the electric board 3 has an obstacle 31 present between itself and the sleeve 11 as shown in FIG. 6, and the electric board 3 is warped upward shown in FIG. 7, because an inadequate amount of thermal energy is supplied from the sleeve 11 to the electric board 3, the heat flux amount detected by the heat flux sensor 27 is varied as in the case of the defective example No. 7 shown in FIG. 4.

During the period counted from the time t0 to the time t2, the heat flux amount detected by the heat flux sensor 27 in the defective example No, 7 is smaller than the heat flux amount in the correct example No, 2 shown in FIG. 4.

Figure 8:
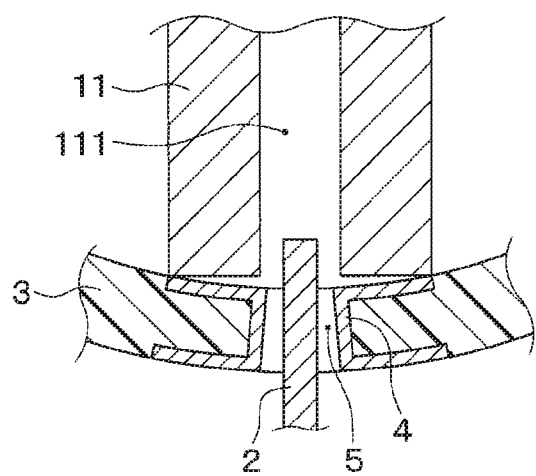

In another defective example shown in FIG. 8, the electric board 3 is warped downward for some reason before the supply of thermal energy from the sleeve 11 to the electric board 3. Accordingly, because it is difficult for the defective example shown in FIG. 8 to have a necessary contact area between the sleeve 11 and the electric board 3, an incorrect soldering process is performed. As a result, this case shown in FIG. 8 produces final products having a solder defect.

When the electric board 3 is warped downward as in the case shown in FIG. 8, the sleeve 11 is not in contact with the electric board 3 at the time when the sleeve 11 reaches the reference position. That is, the sleeve 11 reaches and is in contact with the electric board 3 at a position which is lower than the reference position in the vertical direction. Accordingly, the compression amount of the spring 14 when the supporting member 16 is moved down to the pressure completion position is smaller than that of the correct soldering process. As previously described, the pressure completion position is determined at the time when the pressing of the sleeve 11 to the electric board 3 is completed.

The displacement amount detected by the displacement sensor 26 varies along the defective example No. 3 shown in FIG. 3 when the electric board 3 is warped downward as in the case shown in FIG. 8. During the period counted from the time t0 to the time t2, the displacement amount detected by the displacement sensor 26 in the defective example No. 3 is smaller than the displacement amount in the correct example No. 1.

An inadequate amount of thermal energy is supplied from the sleeve 11 to the electric board 3 when the electric board 3 is warped downward as in the case shown in FIG. 8. In this case shown in FIG. 8, the heat flux amount detected by the heat flux sensor 27 is varied as in the case of the defective example No. 8 shown in FIG. 4.

During the period counted from the time t0 to the time t2, the heat flux amount detected by the heat flux sensor 27 in the defective example No. 8 is smaller than the heat flux amount in the correct example No. 2 shown in FIG. 4.

Figure 9:
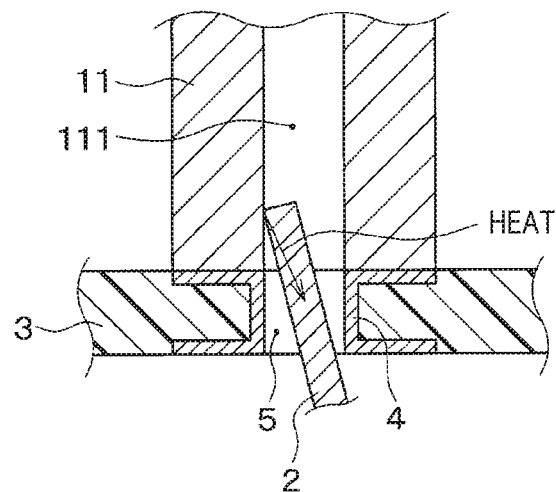

In another defective example shown in FIG. 9, thermal energy is discharged. That is, in the defective example shown in FIG. 9, thermal energy from the sleeve 11 is discharged to another component through the terminal 2 of the electronic component 1 because the sleeve 11 is in contact with the terminal 2 of the electronic component 1 in addition to the terminal 4 of the electric board 3 shown in FIG. 9. If the terminal 2 of the electronic component 1 is curved, the terminal 2 becomes in contact with the sleeve 11 when the electronic component 1 and the electric board 3 are assembled together. Accordingly, because it is difficult for the defective example shown in FIG. 9 to supply a necessary amount of thermal energy from the sleeve 11 to the electric board 3. As a result, this case shown in FIG. 9 produces final products having a solder defect.

In the case shown in FIG. 9, the heat flux amount detected by the heat flux sensor 27 is varied as in the case of the defective example No. 5 shown in FIG. 4.

During the period counted from the time t0 to the time t2, the heat flux amount detected by the heat flux sensor 27 in the defective example No. 5 is greater than the heat flux amount in the correct example No. 2 shown in FIG. 4.

When the sleeve 11 is in contact with another component in a correct contact between the sleeve 11 and the electric board 3, the displacement amount detected by the displacement sensor 26 is varied as in the case of the correct example No. 1 shown in FIG. 3.

On the other hand, when the sleeve 11 is separated from the electric board 3 and the sleeve 11 is in contact with another component, the displacement amount detected by the displacement sensor 26 does not substantially change similar to the case of the defective example No. 4 shown in FIG. 3.

Figure 10:
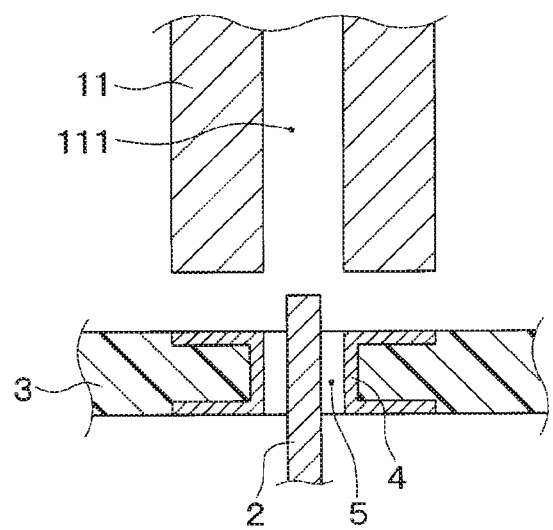

There is another incorrect soldering process shown in FIG. 10 in which the sleeve 11 is not in contact with the terminal 4 of the electric board 3. In this case, it is difficult for the sleeve 11 to supply a necessary amount of thermal energy to the terminal 4 of the electric board 3. As a result, this case shown in FIG. 10 produces final products having a solder defect.

When the sleeve 11 is not in contact with the electric board 3 shown in FIG. 10, the displacement amount detected by the displacement sensor 26 does not substantially change, similar to the case of the defective example No. 4 shown in FIG. 3. Further, the heat flux amount detected by the heat flux sensor 27 does not substantially change similar to the case of the defective example No. 9 shown in FIG. 4.

Figure 11A:
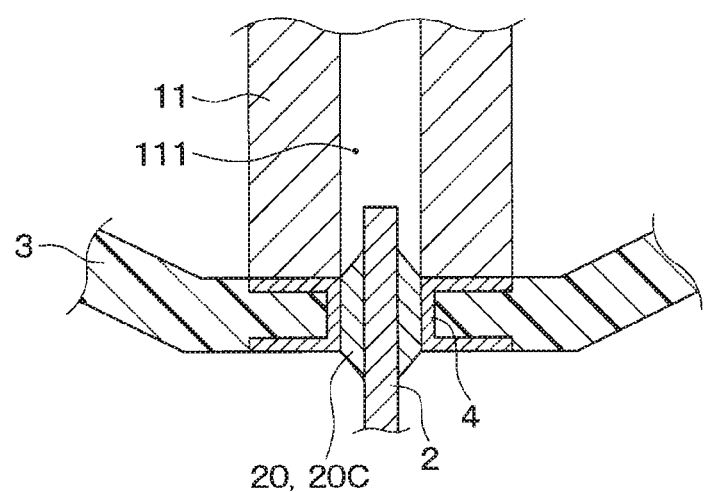
Figure 11B:
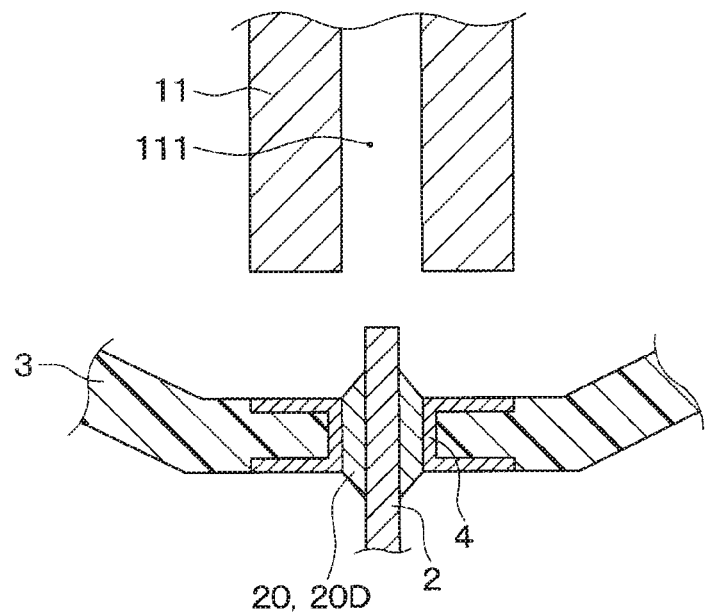
Figure 11C:
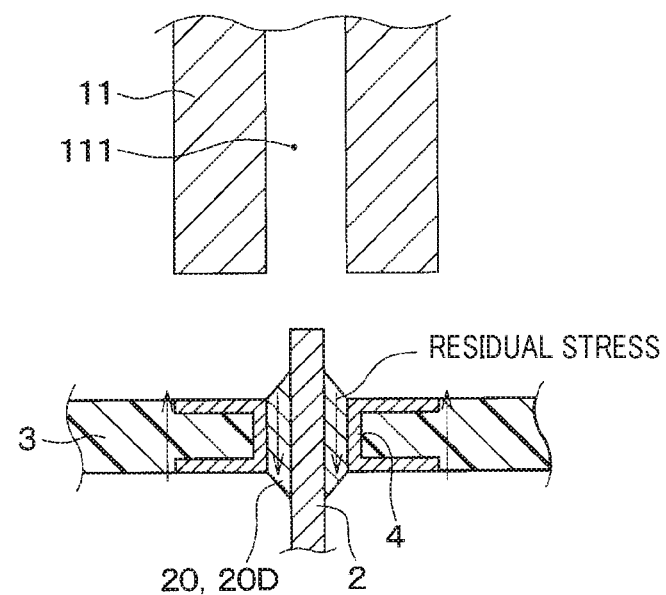

There is another incorrect soldering process shown in FIG. 11A in which the electric board 3 is drastically warped due to thermal energy generated when the electric board 3 is heated. Specifically, as shown in FIG. 11, when the soldering process is performed when the electric board 3 is drastically warped, the melted solder 20C is spread on the terminal 4 of the electric board 3. In this large warped state shown in FIG. 11B, the melted solder 20C is solidified while the sleeve 11 is kept to be separated from the electric board 3. As a result, the produced solder fillet 20D is formed between the terminal 2 of the electronic component 1 and the terminal 4 of the electric board 3. As shown in FIG. 11C, when the electric board 3 is cooled, the electric board 3 is returned to its original condition, and an excess residual stress is generated in the produced solder fillet 20D and the electric board 3, as designated by the arrows shown in FIG. 11C. This excess residual stress causes early occurrence of cracks in the solder 20 formed between the terminal 2 of the electronic component 1 and the terminal 4 of the electric board 3. This reduces the lifetime of the solder 20. As a result, this case shown in FIG. 1A to FIG. 11C produces final products having a solder defect.

In the case in which the electric board 3 is warped by thermal energy shown in FIG. 11A, the displacement amount detected by the displacement sensor 26 is varied similar to the defective example No. 2 shown in FIG. 3. Similar to the case of the correct example No. 1, the displacement amount in the defective example No. 2 shown in FIG. 3 increases according to the elapse of time during the period counted from the time t0 to the time U. As previously explained, the sleeve 11 reaches the reference position in the sleeve soldering device 10 at the time to, and the pressing process of the sleeve 11 to the electric board 3 is completed at the time t1.

However, during the period counted from the time t1 to the time t2, the displacement amount in the defective example No. 2 gradually decreases according to the elapse of time. As previously explained, the thread solder 20A is fed at the time t2.

In this case shown in FIG. 11A, the heat flux amount detected by the heat flux sensor 27 is varied as in the case of the defective example No. 6 shown in FIG. 4. During the period counted from the time t0 to the time t1, the heat flux amount detected by the heat flux sensor 27 in the defective example No. 6 increases similar to the case in the correct example No. 2 shown in FIG. 4.

On the other hand, during the period counted from the time t1 to the time t2 when the thread solder 20A is fed into the sleeve 11, the heat flux amount detected by the heat flux sensor 27 in the defective example No. 6 is smaller than that of the correct example No. 2 shown in FIG. 4.

A description will now be given of the control process of adjusting the behavior of the sleeve soldering device 10 according to the exemplary embodiment.

Figure 12:
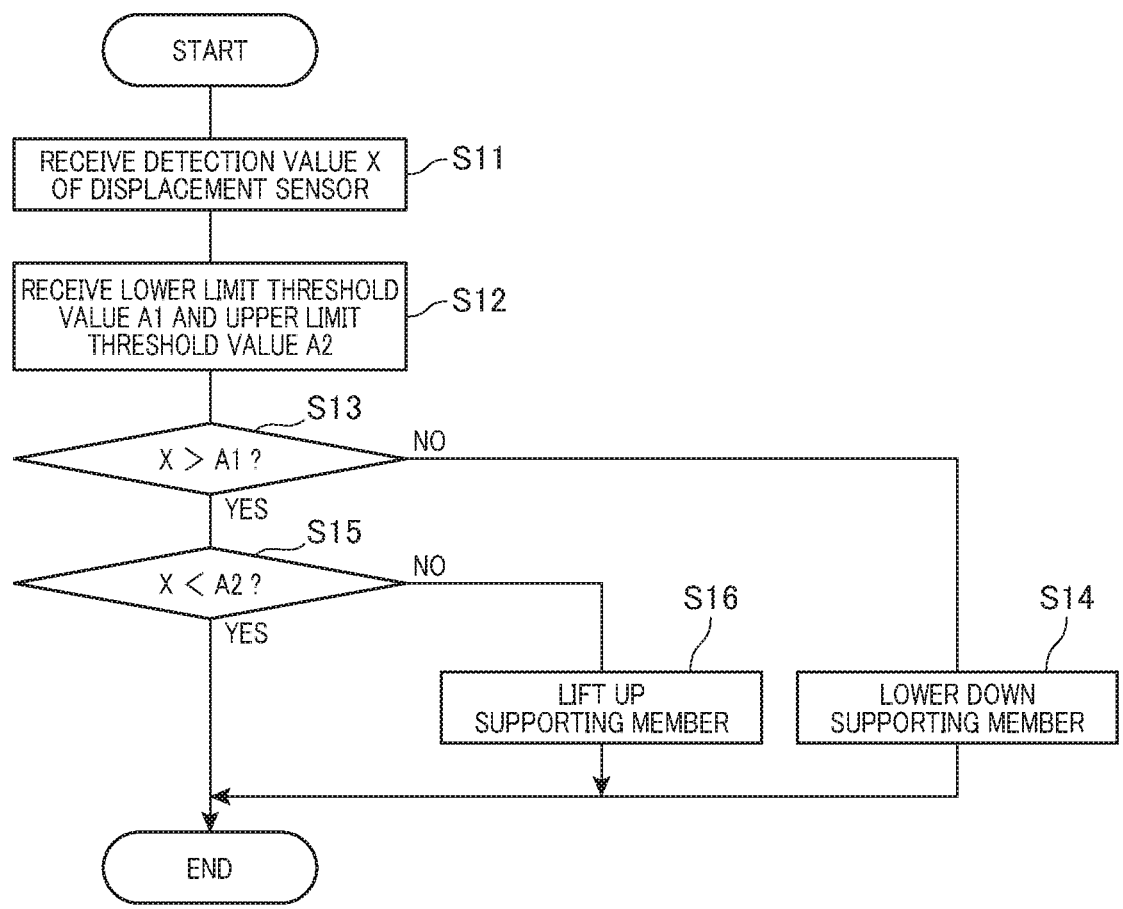
FIG. 12 to FIG. 15 are views, each showing a flow chart for controlling the soldering process performed by the control part in the sleeve soldering device according to the exemplary embodiment.
Figure 13:
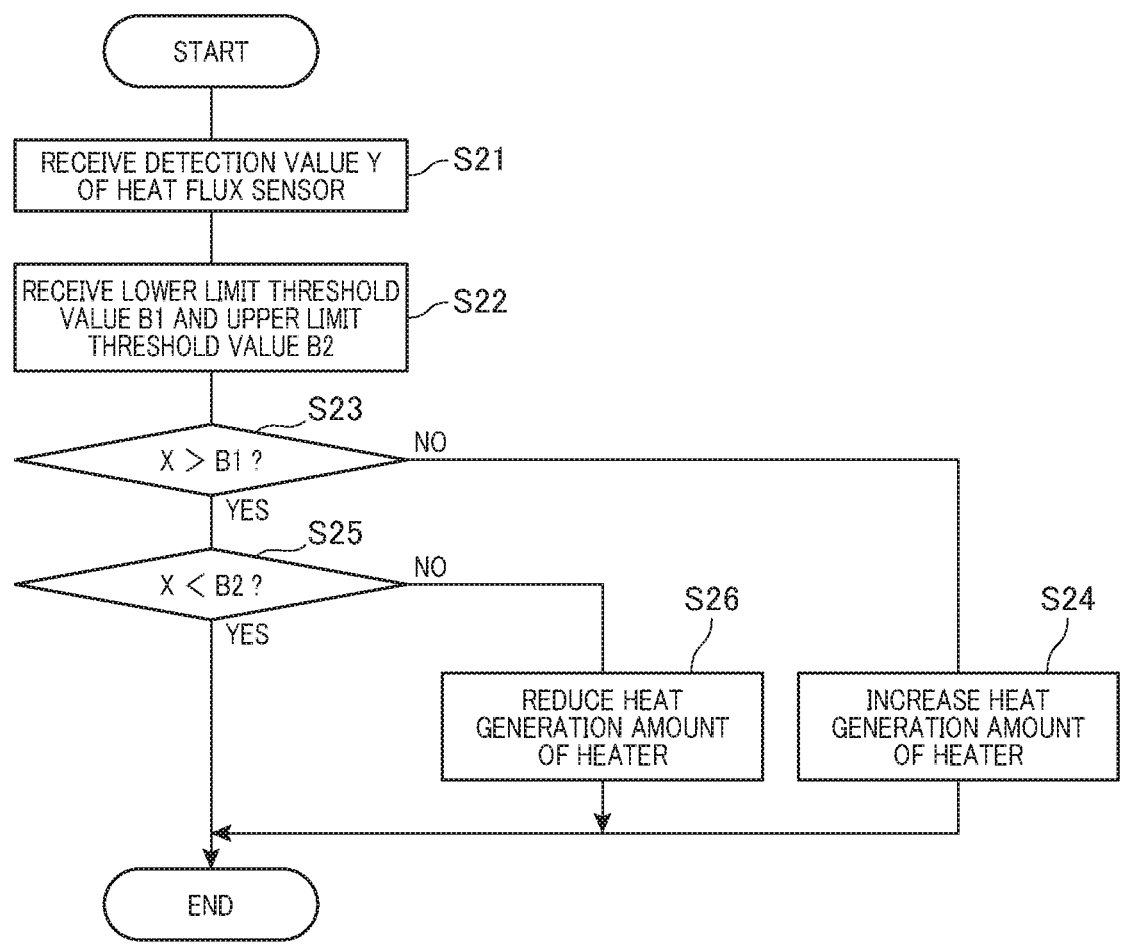

FIG. 12 and FIG. 13 are views, each showing a flow chart for controlling the soldering process performed by the control part 24 in the sleeve soldering device 10 according to the exemplary embodiment.

The control part 24 repeatedly performs the control processes shown in FIG. 12 and FIG. 13 during the period counted from the time t0 when the sleeve 11 reaches the reference position to the time when the sleeve 11 separates from the electric board 3. the control part 24 performs the control processes shown in FIG. 12 and FIG. 13 every predetermined interval. The control processes shown in FIG. 12 and FIG. 13 adjust the behavior of the movement mechanism 23 and the heater 12 so that the spring 14 has a compressed amount and the electric board 3 receives a predetermined heat flux amount. Each of the steps in the flow charts shown in FIG. 12 and FIG. 13 represents a functional block.

As previously explained, the control part 24 is a computer system composed of a known microcomputer, a memory, and peripheral circuits. As shown in FIG. 12, in step S11, the control part 24 receives the detection value X transmitted form the memory. The memory in the control part 24 has stored detection values X detected by and transmitted form the displacement sensor 26. The control part 24 acquires the detection value X detected by the displacement sensor 26 at a predetermined elapsed time counted from the time t0 when the sleeve 11 reaches the reference position.

Every performing the control process shown in FIG. 12, the control part 24 receives a latest detection value X detected by the displacement sensor 26. It is acceptable for the control part 24 to use a value converted from the detection value X transmitted from the displacement sensor 26. The operation flow progresses to step S12.

The memory has stored a lower threshold value A1 and an upper threshold value A2 which have been predetermined.

In step S12, the control part 24 receives the lower threshold value A1 and the upper threshold value A2 transmitted from the memory. Each of the lower threshold value A1 and the upper threshold value A2 is a predetermined judgment reference.

As shown in FIG. 3, each of the lower threshold value A1 and the upper threshold value A2 is determined according to an elapse of time. Each of the lower threshold value A1 and the upper threshold value A2 is determined according to a change of the displacement amount corresponding to the elapse of time when a correct soldering process is performed and an incorrect soldering process is performed.

The lower threshold value A1 and the upper threshold value A2 received by the control part 24 which are determined at the elapse of time when the control part 24 obtains the detection value X in step S11. The operation flow progresses to step S13.

In step S13, the control part 24 detects whether the detection value X is more than the lower threshold value A1.

When the detection result in step S13 is negative ("NO" in step S13), i.e. indicates that detection value X is not more than the lower threshold value A1, the operation flow progresses to step S14.

In step S14, the control part 24 instructs the movement mechanism 23 to lower down the supporting member 16. After the completion of step S14, the control part 24 finishes the control process shown in FIG. 12.

On the other hand, when the detection result in step S13 is positive ("YES" in step S13), i.e. indicates that detection value X is to more than the lower threshold value A1, the operation flow progresses to step S15.

In step S15, the control part 24 detects whether the detection value X is less than the upper threshold value A2.

In step S15, when the detection result in step S15 is positive ("YES" in step S15), i.e. indicates that detection value X is less than the upper threshold value A2, the control part 24 finishes the control process shown in FIG. 12.

When the detection result in step S15 is negative ("NO" in step S15), i.e. indicates that detection value X is not less than the upper threshold value A2, the operation flow progresses to step S16.

In step S16, the control part 24 instructs the movement mechanism 23 to move up the supporting member 16. After the completion of step S16, the control part 24 finishes the control process shown in FIG. 12. Further, the control part 24 returns to step S11, and restarts the process in step S11.

As previously described, the control part 24 repeatedly performs the control process shown in FIG. 12 so as to receive and detect a displacement amount as the detection value X detected by the displacement sensor 26. The control part 24 judges whether the displacement amount as detection value X detected by the displacement sensor 26 satisfies the judgment condition, i.e. detects whether the detection value X is within the range of the lower threshold value A1 and the upper threshold value A2.

When the detection value X is less than the lower threshold value A1, the control part 24 instructs the movement mechanism 23 to lower down the supporting member 16. On the other hand, when the detection value X is more than the upper threshold value A2, the control part 24 instructs the movement mechanism 23 to move up the supporting member 16.

As previously described, when the detection result X as the displacement amount detected by the displacement sensor 26 is not within the range of the lower threshold value A1 and the upper threshold value A2, the control part 24 adjusts the position of the supporting member 16, detected at the following detection, to enter the range of the lower threshold value A1 and the upper threshold value A2.

On the other hand, when the detection value X is within the range between the lower threshold value A1 and the upper threshold value A2, the control part 24 does not adjust the position of the supporting member 16.

In step S21 shown in FIG. 13, the control part 24 receives the detection result Y, as a heat flux amount detected by the heat flux sensor 27, which has been stored in the memory. The detection value Y is detected by the heat flux sensor 27 at a time elapsed by a predetermined time length counted from the time t0 when the sleeve 11 has reached the reference position.

The control part 24 receives a latest detection value Y when performing the control process shown in FIG. 13. It is acceptable for the control part 24 to use a value converted from the detection value Y transmitted from the heat flux sensor 27. The operation flow progresses to step S22.

The memory has stored a lower threshold value B1 and an upper threshold value B2 which have been predetermined.

In step S22, the control part 24 receives the lower threshold value B1 and the upper threshold value B2 stored in and transmitted from the memory. Each of the lower threshold value B1 and the upper threshold value B2 is a predetermined judgment reference.

As shown in FIG. 4, each of the lower threshold value B1 and the upper threshold value B2 is determined according to an elapse of time. Each of the lower threshold value B1 and the upper threshold value B2 is determined according to a change of the heat flux amount corresponding to the elapse of time when a correct soldering process is performed and an incorrect soldering process is performed.

The lower threshold value B1 and the upper threshold value B2 received by the control part 24 are determined at the elapse of time when the control part 24 obtains the detection value Y in step S21. The operation flow progresses to step S23.

In step S23, the control part 24 detects whether the detection value Y is more than the lower threshold value A1.

When the detection result in step S23 is negative ("NO" in step S23), i.e. indicates that detection value Y is not more than the lower threshold value B1, the operation flow progresses to step S24.

In step S24, the control part 24 instructs the heater 12 to increase generated heat amount. After the completion of step S24, the control part 24 finishes the control process shown in FIG. 13.

On the other hand, when the detection result in step S23 is positive ("YES" in step S23), i.e. indicates that detection value Y is more than the lower threshold value B1, the operation flow progresses to step S25.

In step S25, the control part 24 detects whether the detection value Y is less than the upper threshold value B2.

When the detection result in step S25 is positive ("YES" in step S25), i.e. indicates that detection value Y is less than the upper threshold value B2, the control part 24 finishes the control process shown in FIG. 13.

When the detection result in step S25 is negative ("NO" in step S15), i.e. indicates that detection value Y is not less than the upper threshold value B2, the operation flow progresses to step S26.

In step S26, the control part 24 instructs the heater 12 to reduce its heat generation amount. After the completion of step S26, the control part 24 finishes the control process shown in FIG. 13, Further, the control part 24 returns to step S21, and restarts the process in step S21.

As previously described, the control part 24 repeatedly performs the control process shown in FIG. 12 so as to receive and detect a displacement amount as the detection value X detected by the displacement sensor 26. The control part 24 judges whether the displacement amount as detection value X detected by the displacement sensor 26 is within the range of the lower threshold value A1 and the upper threshold value A2.

As previously described, the control part 24 repeatedly performs the control process shown in FIG. 13 so as to receive and detect a heat flux amount as the detection value Y detected by the heat flux sensor 27. The control part 24 repeatedly judges whether the heat flux amount as detection value Y detected by the heat flux sensor 27 satisfies the judgment condition, i.e. detects whether the detection value Y is within the range of the lower threshold value B1 and the upper threshold value B2.

This control makes it possible for the heater 12 to increase the generation amount of thermal energy when the detection value Y is less than the lower threshold value B1, and to reduce the generation amount of thermal energy when the detection value Y is more than the upper threshold value B2.

When the detection value Y is not within the range from the lower threshold value B1 to the upper threshold value B2, the control part 24 adjusts the generation amount of hear energy of the heater 12 so that the detection value Y to be detected at a next detection time enters the range from the lower threshold value B1 to the upper threshold value B2. When the detection value Y enters the range from the lower threshold value B1 to the upper threshold value B2, the control part 24 does not adjust the generation amount of thermal energy from the heater 12.

A description will be given of the control of stopping the soldering process with reference to FIG. 14.

Figure 14:
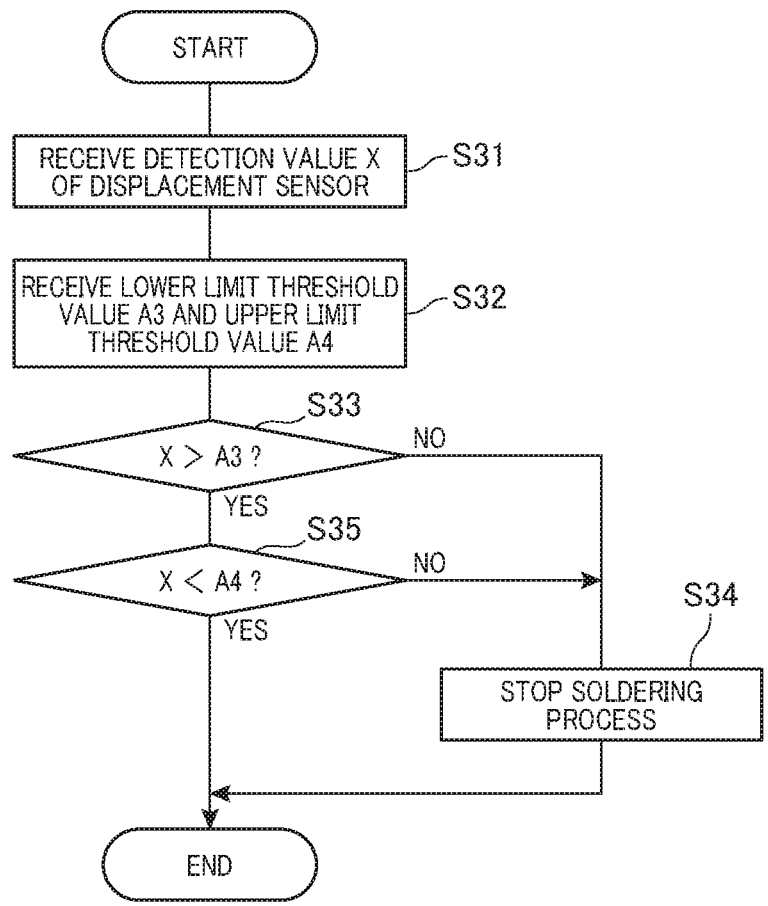
Figure 15:
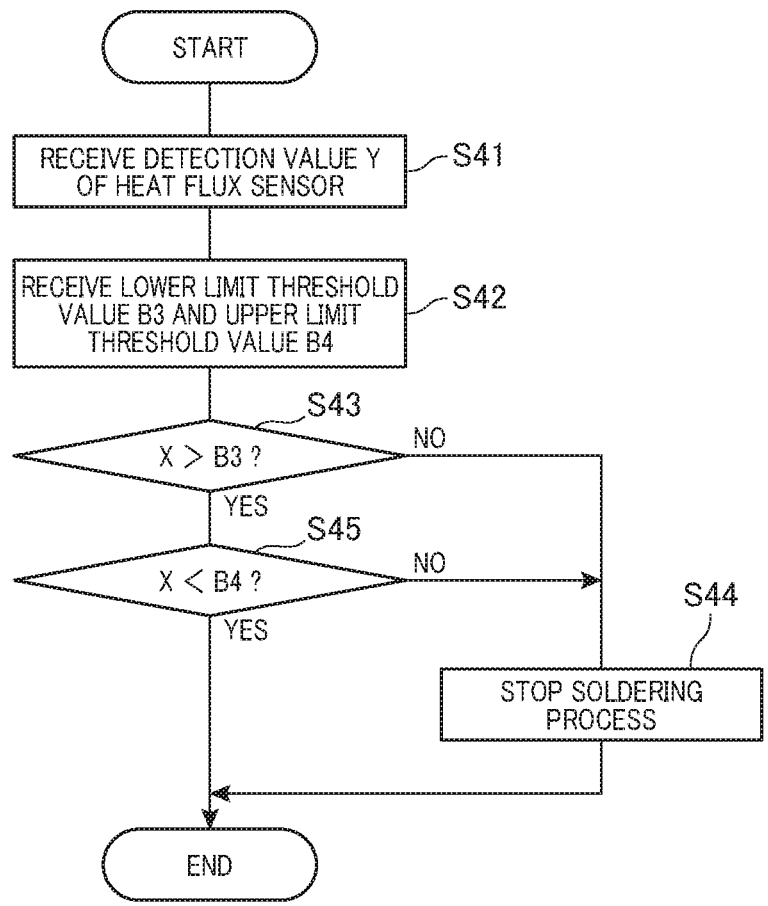

FIG. 14 and FIG. 15 are views, each showing a flow chart for performing the control of stopping the soldering process performed by the control part 24 in the sleeve soldering device 10 according to the exemplary embodiment.

The control part 24 performs the control process shown in FIG. 14 and FIG. 15 when a predetermined period of time is elapsed from the time t0 when the sleeve 11 reaches the reference position.

In each of steps shown in FIG. 14 and FIG. 15 represents a function performed by the control part 24 in the sleeve soldering device 10 according to the exemplary embodiment.

In step S31 shown in FIG. 14, similar to the process in step S11 shown in FIG. 12, the control part 24 receives the detection value X as the displacement amount detected by the displacement sensor 26.

That is, the control part 24 acquires the detection value X detected by the displacement sensor 26 at a predetermined elapsed time counted from the time to when the sleeve 11 reaches the reference position. In this exemplary embodiment, the detection value X is detected at the time t2 when the thread solder 20A is fed into the sleeve 11. The operation flow progresses to step S32.

The memory has stored a lower threshold value A3 and an upper threshold value A4 which are predetermined.

In step S32, similar to step S12 shown in FIG. 12, the control part 24 receives the lower threshold value A3 and the upper threshold value A4 transmitted from the memory. Each of the lower threshold value A3 and the upper threshold value A4 is a predetermined judgment reference. Each of the lower threshold value A3 and the upper threshold value A4 is a fixed value corresponding to the displacement amount detected by the displacement sensor 26, at the time which is equal to the elapsed time when the detection value X is detected in step S31, when a correct soldering process is performed and an incorrect soldering process is performed.

As shown in FIG. 3, in the exemplary embodiment, the lower threshold value A3 and the upper threshold value A4 are equal to the respective lower threshold value A1 and the respective upper threshold value A2 at the time t2 when the thread solder 20A is fed into the sleeve 11. The operation flow progresses to step S33.

In step S33, the control part 24 detects whether the detection value X is more than the lower threshold value A3.

When the detection result in step S33 is negative ("NO" in step S33), i.e. indicates that detection value X is not more than the lower threshold value A3, the operation flow progresses to step S34.

In step S34, the control part 24 stops the execution of the soldering process shown in FIG. 1B. Specifically, the control part 24 instructs the heater 12 to stop generation of thermal energy, and instructs the movement mechanism 23 to separate the sleeve 11 from the electric board 3. After the completion of step S34, the control part 24 finishes the control process shown in FIG. 14.

On the other hand, when the detection result in step S33 is positive ("YES" in step S33), i.e. indicates that detection value X is more than the lower threshold value A3, the operation flow progresses to step S35.

In step S35, the control part 24 detects whether the detection value X is less than the upper threshold value A4.

When the detection result in step S35 is negative ("NO" in step S35), i.e. indicates that detection value X is not less than the upper threshold value A4, the operation flow progresses to step S34.

In step S34, the control part 24 stops the execution of the soldering process. After the completion of step S34, the control part 24 finishes the control process shown in FIG. 14.

On the other hand, when the detection result in step S35 is positive ("YES" in step S35), i.e. indicates that detection value X is less than the upper threshold value A4, the control part 24 finishes the control process shown in FIG. 14.

In step S41 shown in FIG. 15, similar to the process in step S21 shown in FIG. 13, the control part 24 receives the detection result Y, as a heat flux amount detected by the heat flux sensor 27, which has been stored in the memory. The detection value Y is detected by the heat flux sensor 27 at a time elapsed by a predetermined time length counted from the time to when the sleeve 11 has reached the reference position.

The detection value Y is a value detected by the heat flux sensor 27 at the time t2 when the thread solder 20A is supplied into the sleeve 11. The operation flow progresses to step S42.

The memory has stored a lower threshold value B3 and an upper threshold value B4 which have been predetermined.

In step S42, similar to step S22 shown in FIG. 13, the control part 24 receives the lower threshold value B4 and the upper threshold value B4 stored in and transmitted from the memory. Each of the lower threshold value B3 and the upper threshold value B4 is a predetermined judgment reference.

Each of the lower threshold value B3 and the upper threshold value B4 is a fixed value corresponding to the heat flux amount detected by the heat flux sensor 27, at the time which is equal to the elapsed time when the detection value X is detected in step S31, when a correct soldering process is performed and an incorrect soldering process is performed.

As shown in FIG. 4, in the exemplary embodiment, the lower threshold value A3 and the upper threshold value A4 are equal to the respective lower threshold value A1 and the respective upper threshold value A2 at the time t2 when the thread solder 20A is fed into the sleeve 11. The operation flow progresses to step S43.

In step S43, the control part 24 detects whether the detection value Y is more than the lower threshold value B3.

When the detection result in step S43 is negative ("NO" in step S43), i.e. indicates that detection value Y is not more than the lower threshold value B3, the operation flow progresses to step S44.

In step S44, the control part 24 stops the execution of the soldering process. Specifically, the control part 24 instructs the heater 12 to stop the generation of thermal energy, and instructs the movement mechanism 23 to separate the sleeve 11 from the electric board 3. After the completion of step S44, the control part 24 finishes am the control process shown in FIG. 15.

On the other hand, when the detection result in step S43 is positive ("YES" in step S43), i.e. indicates that detection value Y is more than the lower threshold value B3, the operation flow progresses to step S45.

In step S45, the control part 24 detects whether the detection value Y is less than the upper threshold value B4.

When the detection result in step S45 is negative ("NO" in step S45), i.e. indicates that detection value Y is not less than the upper threshold value B4, the operation flow progresses to step S44.

In step S44, the control part 24 stops the execution of the soldering process. After the completion of step S44, the control part 24 finishes the control process shown in FIG. 15.

On the other hand, when the detection result in step S45 is positive ("YES" in step S45), i.e. indicates that detection value Y is less than the upper threshold value B4, the control part 24 finishes the control process shown in FIG. 15.

That is, the control part 24 stops the execution of the soldering process when the detection value X of the displacement sensor 26 is out of the range from the lower threshold value A3 to the upper threshold value A4. In addition, the control part 24 stops the execution of the soldering process when the detection value Y of the heat flux sensor 27 is out of the range from the lower threshold value B3 to the upper threshold value B4.

As previously described, in each of the cases when the electric board 3 is tilted shown in FIG. 5, the obstacle 31 is present between the sleeve 11 and the electric board 3 shown in FIG. 6, and the electric board 3 is warped upward shown in FIG. 7, the detection value X detected by the displacement sensor 26 is changed along the curve designated by the defective example No. 1 shown in FIG. 3. Accordingly, the detection value X detected by the displacement sensor 26, at the time t2 when thread solder 20A is fed into the sleeve 11, is out from the range of the lower threshold value A3 to the upper threshold value A4. In addition, the detection value Y detected by the heat flux sensor 27 is changed along the curve designated by the defective example No. 7 shown in FIG. 4. Accordingly, the detection value Y detected by the heat flux sensor 27, time t2 when thread solder 20A is fed into the sleeve 11, is out from the range of the lower threshold value B3 to the upper threshold value B4. In each of the cases shown in FIG. 5 to FIG. 7, the control part 24 stops the execution of the soldering process.

In the case in which the electric board 3 is warped downward for some reason before the supply of thermal energy from the sleeve 11 to the electric board 3, the detection value X detected by the displacement sensor 26 is changed along the curve designated by the defective example No. 3 shown in FIG. 3. Accordingly, the detection value X detected by the displacement sensor 26, at the time t2 when thread solder 20A is fed into the sleeve 11, is out of the range of the lower threshold value A3 to the upper threshold value A4. In addition, the detection value Y detected by the heat flux sensor 27 is changed along the curve designated by the defective example No. 8 shown in FIG. 4. Accordingly, the detection value Y detected by the heat flux sensor 27 at time t2 when thread solder 20A is fed into the sleeve 11 is out from the range of the lower threshold value B3 to the upper threshold value B4. In the case shown in FIG. 8, the control part 24 stops the soldering process.

In the defective example shown in FIG. 9, thermal energy from the sleeve 11 is discharged to another component through the terminal 2 of the electronic component 1 because the sleeve 11 is in contact with the terminal 2 of the electronic component 1 in addition to the terminal 4 of the electric board 3 shown in FIG. 9. In this case, the detection value Y detected by the heat flux sensor 27 varies along the curve designated by the defective example No. 5 shown in FIG. 4.

Accordingly, the detection value Y detected by the heat flux sensor 27, at the time t2 when thread solder 20A is fed into the sleeve 11, is out of the range of the lower threshold value B3 to the upper threshold value B4. In the case shown in FIG. 9, the control part 24 stops the soldering process.

In the case in which the sleeve 11 is not in contact with the electric board 3 shown in FIG. 10, the detection value X detected by the displacement sensor 26 is changed along the curve designated by the defective example No. 4 shown in FIG. 3. Accordingly, the detection value X detected by the displacement sensor 26, at the time t2 when thread solder 20A is fed into the sleeve 11, is out of the range of the lower threshold value A3 to the upper threshold value A4. In addition, the detection value Y detected by the heat flux sensor 27 is changed along the curve designated by the defective example No. 9 shown in FIG. 4. Accordingly, the detection value Y detected by the heat flux sensor 27 at time t2 when thread solder 20A is fed into the sleeve 11 is out from the range of the lower threshold value B3 to the upper threshold value B4. In the case shown in FIG. 10, the control part 24 stops the soldering process.

In the case in which the electric board 3 is warped by thermal energy shown in FIG. 11A, the detection value X as the displacement amount detected by the displacement sensor 26 is changed along the curve shown in the defective example No. 2 shown in FIG. 3. Accordingly, the detection value X detected by the displacement sensor 26, at the time t2 when thread solder 20A is fed into the sleeve 11, is out of the range of the lower threshold value A3 to the upper threshold value A4. In addition, the detection value Y detected by the heat flux sensor 27 is changed along the curve designated by the defective example No. 6 shown in FIG. 4. Accordingly, the detection value Y detected by the heat flux sensor 27 at time t2 when thread solder 20A is fed into the sleeve 11 is out from the range of the lower threshold value B3 to the upper threshold value B4. In the case shown in FIG. 11A, the control part 24 stops the soldering process.

On the other hand, the detection value X detected by the displacement sensor 26, at the time t2 when thread solder 20A is fed into the sleeve 11, is within the range of the lower threshold value A3 to the upper threshold value A4, and the detection value Y detected by the heat flux sensor 27, at the time t2 when thread solder 20A is fed into the sleeve 11, is within the range of the lower threshold value 133 to the upper threshold value B4, the control part 24 continues the execution of the soldering process. This control performs the correct soldering process.

As previously described, the displacement sensor 26 detects a displacement amount as a physical quantity related to a press force of the sleeve 11 to the electric board 3 when the heated sleeve 11 is pressed to the electric board 3. Further, the displacement sensor 26 detects the physical quantity as a deformation amount of the electric board 3 when the electric board 3 is heated by thermal energy of the heater 12 supplied through the heated sleeve 11. The heat flux sensor 27 detects the physical quantity related to the heat transfer amount of thermal energy from the heater 12 to the electric board 3.

The control part 24 receives the detection value X detected by the displacement sensor 26 in step S11 shown in FIG. 12 and in step S31 shown in FIG. 14.

The control part 24 compares the detection value X with the predetermined judgment value, where the detection value X is detected in step S13 and step S15 shown in FIG. 12, and step S33 and step S35 shown in FIG. 14. The control part 24 judges whether the detection value X satisfies the judgment condition.

In step S21 shown in FIG. 13 and step S41 shown in FIG. 15, the control part 24 receives the detection value Y detected by the heat flux sensor 27. In step S23 and step S25 shown in FIG. 13 and step S43 and step S45 shown in FIG. 15, the control part 24 compares the detection value Y detected by the heat flux sensor 27 with the predetermined judgment reference and determines whether the detection value Y satisfies the judgment condition.

When the judgment result indicates that one of the pressure value, the thermal energy transmission amount, and the deformation amount is an incorrect value, it is determined for the control part 24 performs an incorrect soldering process. When the pressure value and the deformation amount are correct values, it is known that the detection value X detected by the displacement sensor 26 is changed along the curve designated by the correct example No. 1 shown in FIG. 3.

On the other hand, when the pressure and the deformation amount are incorrect values, it is known that the detection value X detected by the displacement sensor 26 is changed along the curves designated by the defective examples No. 1 to No. 4 shown in FIG. 3.

Similarly, when the heat transfer amount is a correct value, it is known that the detection value Y detected by the heat flux sensor 27 is changed along the curve designated by the correct example No. 2 shown in FIG. 4.

On the other hand, when the heat transfer amount is a incorrect value, it is known that the detection value Y detected by the heat flux sensor 27 is changed along the curves designated by the defective examples No. 5 to No. 9 shown in FIG. 4.

Accordingly, the control part 24 uses the predetermined judgment references which have been determined on the basis of physical quantities obtained by a correct soldering process and physical quantities obtained by an incorrect soldering process. The use of those physical quantities makes it possible to judge whether the correct soldering process is performed.

The sleeve soldering device 10 according to the exemplary embodiment performs the soldering process using the sleeve 11 in which the solder 20 is fed into the sleeve 11, the solder 20 is melted inside the sleeve 11 and the fillet is formed by using the sleeve 11. For this reason, it is difficult to monitor the soldering process by visual inspection or by using a monitor camera.

In order to avoid this drawback, the sleeve soldering device 10 according to the exemplary embodiment detects the various physical quantities related to the pressure value, the heat transfer amount, the deformation amount, and compares these quantities with the respective judgment references. This control makes it possible for the sleeve soldering device 10 to detect whether the correct soldering process is performed on the basis of the comparison results.

When the detection result in each of step S13 and step S15 shown in FIG. 12 indicates that the detected physical quantity does not satisfy its judgment reference, the control part 24 instructs the movement mechanism 23 to adjust the pressure from the sleeve 11 to the electric board 3 so that a next detection value detected by the displacement sensor 26 satisfies the respective judgment reference. This control makes it possible to perform the correct soldering process by adjusting the pressure from the sleeve 11 to the electric board 3 only. In other words, this control makes it possible to reduce the production of products having a soldering defect.

Further, when the detection result in each of step S23 and step S25 shown in FIG. 13 indicates that the detected physical quantity does not satisfy its judgment reference, the control part 24 instructs the heater 12 to adjust the generation amount of thermal energy so that a next detection value detected by the heat flux sensor 27 satisfies the respective judgment reference. This control makes it possible to perform the correct soldering process by adjusting the pressure value of the sleeve 11 to the electric board 3 only. In other words, this control makes it possible to reduce the production of products having a soldering defect.

Still further, when the detection result in each of step S33 and step S35 shown in FIG. 14, and the detection result in each of step S43 and step S45 shown in FIG. 15 indicate that the detected physical quantity does not satisfy its judgment reference, the control part 24 stops the execution of the soldering process. This control makes it possible to avoid products having a soldering defect from being produced.

That is, it is possible to detect whether the correct soldering process is performed on the basis of the detection results. When an incorrect soldering process is performed, the control part 24 stops the execution of the soldering process during the soldering process.

In the structure of the sleeve soldering device 10 according to the exemplary embodiment, the displacement sensor 26 and the heat flux sensor 27 correspond to the detection part. The processes in step S13, step S15, step S23, step S25, step S33, step S35, step S43 and step S45 correspond to the detection part for comparing the detection value detected by the detection part with the predetermined judgment value, and for detecting whether the detection value satisfies the judgment condition.

The processes in step S14 and step S16 correspond to the pressure control part for adjusting a pressure from the sleeve 11 to the electric board 3 on the basis of the control of the movement mechanism 23.

The processes in step S24 and step S26 correspond to the thermal energy amount control part for adjusting a thermal energy amount of the heater 12 when the detection result in step S24 and step S26 indicates that the judgment condition is not satisfied.

The sleeve soldering device 10 according to the exemplary embodiment detects three quantities, i.e. the physical quantity related to the pressure, the physical quantity related to the deformation amount, the physical quantity related to the heat transfer amount. That is, the exemplary embodiment detects one of those quantities related to the pressure, the deformation amount, and the heat transfer amount.

Other Modifications

The concept of the present disclosure is not limited by the exemplary embodiment of the sleeve soldering device 10 previously described. It is possible for the present disclosure to have various modifications as follows.

(1) In the exemplary embodiment previously described, the control part 24 stops the soldering process in step S34 shown in FIG. 14 and step S44 shown in FIG. 15. However, the concept of the present disclosure is not limited by this exemplary embodiment. It is possible for the control part 24 to continue the execution of the soldering process, and to add information regarding incorrect soldering process to products. When an incorrect soldering process is performed, it is possible to add information regarding an incorrect soldering process to an electronic device during the soldering process.

This control allows the sleeve soldering device 10 to repeatedly perform the execution of the soldering process without stopping the sleeve soldering device 10. Because the information regarding an incorrect soldering process is added onto the product having a soldering defect, it is possible to eliminate the product having the soldering defect, and to prevent the product having the soldering defect to be transmitted to a next production step. This makes it possible to eliminate the product having the soldering defect from the products without soldering defect.

(2) In the control process shown in FIG. 14 and FIG. 15 performed by the sleeve soldering device 10 according to the exemplary embodiment previously described the control part 24 uses the detection value X and the detection value Y detected at the time t2 when thread solder 20A is fed into the sleeve 11. However, the concept of the present disclosure is not limited by this exemplary embodiment. For example, it is acceptable for the control part 24 to use the detection value X and the detection value Y detected at a time before the time t2.

(3) In the exemplary embodiment previously described, the control part 24 performs the control processes shown in FIG. 12, FIG. 13, FIG. 14 and FIG. 15. However, the concept of the present disclosure is not limited by this exemplary embodiment. For example, it is acceptable for the control part 24 to perform the control processes shown in FIG. 12 and FIG. 13, or the control processes shown in FIG. 14 and FIG. 15. Further, it is acceptable for the control part 24 to perform only one of the processes shown in FIG. 14 and FIG. 15.

(4) In control process shown in FIG. 14 in the exemplary embodiment previously described, the control part 24 uses the lower threshold value A3 and the upper threshold value A4 which are the same as the lower threshold value A1 and the upper threshold value A2 used, at the time t2 when the thread solder 20 A is fed into the sleeve 11, in the control process shown in FIG. 12. However, the concept of the present disclosure is not limited by this exemplary embodiment. It is possible for the control part 24 to use a different threshold value in the control process shown in FIG. 14 and the control process shown in FIG. 12.

Similarly, in control process shown in FIG. 15, the control part 24 uses the lower threshold value B3 and the upper threshold value B4 which are the same as the lower threshold value B1 and the upper threshold value B2 used, at the time t2 when the thread solder 20 A is fed into the sleeve 11, in the control process shown in FIG. 13. However, the concept of the present disclosure is not limited by this exemplary embodiment. It is possible for the control part 24 to use a different threshold value in the control process shown in FIG. 15 and the control process shown in FIG. 13.

(5) The exemplary embodiment previously described uses the displacement sensor 26 as the detection part for detecting a physical quantity related to the pressure from the sleeve 11 to the electric board 3. However, the concept of the present disclosure is not limited by this exemplary embodiment. It is possible to use, as the detection part, a load cell, a pressure sensor, etc. Each of the load cell and the pressure sensor is arranged between the sleeve 11 and the electric board 3. It is acceptable for the load cell or the pressure sensor to directly detect a magnitude of the pressure from the sleeve 11 to be pressed to the electric board 3.

(6) In the exemplary embodiment previously described, the sleeve soldering device 10 uses the displacement sensor 26 to detect the physical quantity related to the deformation amount of the electric board 3 caused by thermal energy generated by the heater 12 and supplied through the sleeve 11. However, the concept of the present disclosure is not limited by this exemplary embodiment. It is possible to use a servomotor with a built-in encoder as the detection part for detecting a displacement amount of the electric board 3. In this case, the servomotor adjusts a vertical position of the sleeve 11. Such a built-in encoder in the servomotor detects a rotation angle of a feed screw of the servomotor. When a vertical position of the sleeve 11 is changed by the deformation of the electric board 3 due to thermal energy, the rotation angle of the feed screw of the servomotor varies. It is possible to detect the displacement amount in the vertical direction of the sleeve 11 on the basis of the displacement amount in rotation angle of the encoder. The displacement amount in the vertical direction of the sleeve 11 is a physical quantity related to the displacement amount of the electric board 3.

It is acceptable for the detection part to detect a displacement amount in the axial direction of the sleeve 11 which is compared with the position of the sleeve 11 at the time t1 when the pressing process of the sleeve 11 to the electric board 3 is completed shown in FIG. 3. That is, at the time t1 when the movement mechanism 23 finishes the execution of the pressing process in which the sleeve 11 presses the electric board 3.

(7) In the exemplary embodiment previously described, the sleeve soldering device 10 uses the heat flux sensor 27 as the detection part for detecting the physical quantity related to a heat flux amount supplied to the electric board 3. However, the concept of the present disclosure is not limited by this exemplary embodiment. It is possible to use a temperature sensor as the detection part for detecting a temperature of the electric board 3.

(8) In the exemplary embodiment previously described, the sleeve soldering device 10 detects three quantities related to the pressure, the displacement amount and the heat transfer amount. However, the concept of the present disclosure is not limited by this exemplary embodiment. It is possible for the sleeve soldering device 10 detect and use one of the three quantities, or possible to detect two quantities from the three physical quantities. In the cases previously described, the sleeve soldering device 10 detects and uses a one to one correspondence between the three physical quantities and the pressure, the displacement amount and the heat transfer amount.

There is a possible case in which one of the three physical quantities related to the pressure, the displacement amount and the heat flux amount satisfies the predetermined judgment reference even if an incorrect soldering process is performed. For example, this indicates the situation in which the sleeve 11 is in contact with another component while the sleeve 11 is in contact with the electric board 3. In this case, the heat flux amount detected by the heat flux sensor 27 is changed along the curve representing the defective example No. 5 shown in FIG. 4. On the other hand, the displacement amount detected by the displacement sensor 26 is changed along the curve representing the correct example No. 1 shown in FIG. 3.

In this case, it is preferable for the detection part to detect both the physical quantities related to the pressure and the heat transfer amount when compared with the case in which the detection part detects one of the physical quantity related to the pressure and the physical quantity related to the heat transfer amount. This detection makes it possible to monitor whether the correct soldering process is performed when compared with the case in which the detection part detects one of the physical quantity related to the pressure and the physical quantity related to the heat transfer amount.

(9) In the exemplary embodiment previously described, the detection part is mounted on the sleeve soldering device 10. However, the concept of the present disclosure is not limited by this exemplary embodiment. It is possible to mount the detection part onto a product jig or a product itself such as the electric board 3 as the soldering target.

(10) For example, a less heat transfer amount may be caused due to contamination of the sleeve 11. In this case, it is acceptable for an information part in the sleeve soldering device 10 to inform occurrence of contamination in the sleeve 11 to an operator.

(11) It is possible to further reduce the number of products with a soldering defect when a combination of the present disclosure and a method disclosed in Japanese patent laid open publication No. 2018-69288 is used.

(12) The concept of the present disclosure is not limited by the exemplary embodiment and the modifications thereof previously described. While specific embodiments of the present disclosure have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present disclosure which is to be given the full breadth of the following claims and all equivalents thereof.

(13) It is acceptable to realize the functions of the control part 24 and the soldering method performed by the control part 24 by using a dedicated computer composed of a processor and a memory, or a dedicated computer composed of a processor composed of one or more dedicated hardware logical circuits, or a processor and a memory and a processor composed of one or more hardware logical circuits.

In addition, it is acceptable to use a non-transitory computer readable storage medium for storing programs for causing the processor to execute those functions of the control part 24 in the sleeve soldering device 10 according to the exemplary embodiment.

As previously described in detail, the sleeve soldering device according to the exemplary embodiment and modifications of the present disclosure has the following aspects.

The sleeve soldering device according to the first aspect of the present disclosure has a following feature.

The sleeve soldering device performs the soldering process of the terminal of the electronic component and the terminal of the electric board. The sleeve soldering device has the sleeve, the heater, the movement mechanism, the detection part, and the judgment part. The sleeve has the through hole through which the solder is passed and fed. The sleeve provides thermal energy when being in contact with the electric board. The sleeve feeds the solder to the soldering part between the terminal of the electronic component and the terminal of the electric board. The heater generates thermal energy and heats the sleeve by the generated thermal energy. The movement mechanism moves the heated sleeve when the sleeve is in contact with and pressed to the electric board. The detection part detects at least one of the physical quantity related to a pressure from the sleeve to the electric board when the sleeve presses the electric board, a physical quantity related to a heat transfer amount of thermal energy generated by the heater supplied to the electric board when the sleeve presses the electric board, and the physical quantity related to a deformation amount of the electric board due to the thermal energy generated by the heater. The judgment part compares the detection value of the physical quantity detected by the detection part with the predetermined judgment reference, and detects whether the detection value satisfies the predetermined judgment reference on the basis of the comparison result.

The sleeve soldering device according to the second aspect of the present disclosure has a following feature.

The detection part detects the physical quantity related to a pressure from the sleeve to the electric board and the physical quantity related to a heat transfer amount of thermal energy generated by the heater supplied to the electric board. This feature makes it possible to detect whether the correct soldering process is performed with high accuracy while monitoring the soldering process when compared with a case in which only one of the physical quantity related to the pressure and the physical quantity related to the heat transfer amount is detected and used.

The sleeve soldering device according to the third aspect of the present disclosure has a following feature.

The sleeve soldering device further has a spring which supports an assembly structure. The assembly structure has the sleeve. In the sleeve soldering device, the movement mechanism presses the sleeve onto the electric board while the spring supports the assembly structure. The detection part detects a change amount in length of the spring so as to obtain the physical quantity related to the pressure from the sleeve to the electric board.

In a case in which the spring supports the assembly structure having the sleeve, the length of the spring varies due to a magnitude of the pressure from the sleeve supplied to the electric board. Accordingly, it is possible to detect a change amount in length of the spring as the physical quantity related to the pressure from the sleeve to the electric board when the spring supports the assembly structure having the sleeve.

The sleeve soldering device according to the fourth aspect of the present disclosure has a following feature.

The detection part detects a heat flux amount of thermal energy generated by the heater supplied from the sleeve to the electric board. That is, it is possible to detect a heat flux of the heater supplied to the electric board through the sleeve as the physical value related to the heat transfer amount.

The sleeve soldering device according to the fifth aspect of the present disclosure has a following feature.

The detection part detects a displacement amount of the sleeve in an axial direction of the sleeve as the physical quantity related to the deformation amount of the electric board due to the thermal energy generated by the heater. That is, it is possible to detect a displacement amount in the axial direction of the sleeve as the physical value related to the deformation amount.

The sleeve soldering device according to the sixth aspect of the present disclosure has a following feature.

The detection part repeatedly detects the physical quantity related to the pressure from the sleeve to the electric board. The judgment part repeatedly detects whether a detection value as the physical quantity detected by the detection part satisfies the predetermined judgment reference. The sleeve soldering device further comprises a control part. In the sleeve soldering device, when a detection result of the judgment part indicates that the detection value does not satisfy the predetermined judgment reference, the control part instructs the movement mechanism so as to adjust a pressure from the sleeve to the electric board so that a following detection value detected by the detection part satisfies the predetermined judgment reference.

Accordingly, it is preferable to perform the control of behavior of the movement mechanism so as to perform the correct soldering process on the basis of the judgment result. This makes it possible to perform the correct soldering process, and to reduce the total number of products having a soldering defect.

The sleeve soldering device according to the seventh aspect of the present disclosure has a following feature.

The detection part repeatedly detects the physical quantity related to the heat transfer amount of thermal energy generated by the heater supplied to the electric board. The judgment part repeatedly detects whether a detection value as the physical quantity detected by the detection part satisfies the predetermined judgment reference. The sleeve soldering device further comprises a control part.

A detection result of the judgment part indicates that the detection value does not satisfy the predetermined judgment reference, the control part instructs the heater so as to adjust a pressure from the sleeve to the electric board so that a following detection value detected by the detection part satisfies the predetermined judgment reference. Accordingly, it is preferable to adjust the amount of thermal energy generated by the heater so as to perform the correct soldering process on the basis of the judgment result. This makes it possible to perform the correct soldering process, and to reduce the total number of products having a soldering defect.

The computer implemented method according to the eighth aspect of the present disclosure has a following feature.

The computer implemented method manufactures an electronic device. The electronic device is composed of an electronic component and an electric board. The method performs the soldering process between the terminal of the electronic component and the terminal of the electric board sleeve by using the sleeve soldering device. The sleeve soldering device has the sleeve in which the through hole is formed, the movement mechanism and the heater. The heater heats the sleeve. In the sleeve soldering device, the solder is fed into the through hole of the sleeve. The movement mechanism moves the sleeve. The computer implemented method performs a movement step which moves, i.e. lower down the sleeve by the movement mechanism to the electric board so as to press the sleeve heated by thermal energy generated by the heater to the electric board (S1, S2, S3). The computer implemented method performs a solder feeding step which feeds a solder to a soldering part between the terminal of the electronic component and the terminal of the electric board through the through hole formed in the sleeve while the sleeve is pressed to the electric board.

The computer implemented method performs a detection step which obtains a detection value detected by a detection part as one of: a physical quantity related to a pressure from the sleeve to the electric board when the sleeve heated by thermal energy generated by the heater is pressed to the electric board, a physical quantity related to a heat flux amount supplied from the heater to the electric board through the sleeve when the sleeve heated by thermal energy generated by the heater is pressed to the electric board, and a physical quantity related to a deformation amount of the electric board due to the thermal energy generated by the heater.

The computer implemented method performs a judgment step for comparing the detection value with a predetermined reference and judging whether the detection value satisfies the predetermined reference on the basis of a comparison result.

The computer implemented method according to the ninth aspect of the present disclosure has a following feature.

In the detection step, the detection part detects the physical quantity related to the pressure from the sleeve to the electric board and the physical quantity related to the heat transfer amount of thermal energy generated by the heater supplied to the electric board. This feature makes it possible to detect whether the correct soldering to process is performed with high accuracy while monitoring the soldering process when compared with a case in which only one of the physical quantity related to the pressure and the physical quantity related to the heat transfer amount is detected and used.

The computer implemented method according to the tenth aspect of the present disclosure has a following feature.

The sleeve soldering device used in the method has the spring for supporting an assembly structure having the sleeve. In the movement step, the movement mechanism presses the sleeve onto the electric board while the spring supports the assembly structure. In the detection step, the detection part detects a change amount in length of the spring so as to obtain the physical quantity related to the pressure from the sleeve to the electric board.

In a case in which the spring supports the assembly structure having the sleeve, the length of the spring varies due to a magnitude of the pressure from the sleeve supplied to the electric board. Accordingly, it is possible to detect a change amount in length of the spring as the physical quantity related to the pressure from the sleeve to the electric board when the spring supports the assembly structure having the sleeve.

The computer implemented method according to the eleventh aspect of the present disclosure has a following feature.

In the detection step, the detection part detects a heat flux amount of thermal energy generated by the heater supplied from the sleeve to the electric board. That is, it is possible to detect a heat flux of the heater supplied to the electric board through the sleeve as the physical value related to the heat transfer amount.

The computer implemented method according to the twelve aspect of the present disclosure has a following feature.

In the detection step, the detection part detects a displacement amount of the sleeve in an axial direction of the sleeve as the physical quantity related to the deformation amount of the electric board due to the thermal energy generated by the heater. That is, it is possible to detect a displacement amount in the axial direction of the sleeve as the physical value related to the deformation amount.

The computer implemented method according to the thirteenth aspect of the present disclosure has a following feature.

In the detection step, the detection part repeatedly detects the physical quantity related to the pressure from the sleeve to the electric board. The judgment step repeatedly obtains a detection value related to the physical quantity detected by the detection part, and repeatedly detects whether the detection value satisfies a predetermined reference. When a detection result of the judgment step indicates that the detection value does not satisfy the predetermined judgment reference, a behavior of the movement mechanism is adjusted to adjust a position of the sleeve so that a following detection value detected by the detection part satisfies the predetermined judgment reference.

Accordingly, it is preferable to perform the control of behavior of the movement mechanism so as to perform the correct soldering process on the basis of the judgment result. This makes it possible to perform the correct soldering process, and to reduce the total number of products having a soldering defect.

The computer implemented method according to the fourteenth aspect of the present disclosure has a following feature.

In the detection step, the detection part repeatedly detects the physical quantity related to the heat transfer amount of the sleeve to the electric board. The judgment step repeatedly obtains a detection value related to the physical quantity detected by the detection part, and repeatedly detects whether the detection value satisfies a predetermined reference. When a detection result of the judgment step indicates that the detection value does not satisfy the predetermined judgment reference, a behavior of the heater is adjusted to adjust the heat flux amount of the heater so that a following detection value detected by the detection part satisfies the predetermined judgment reference.

Accordingly, it is preferable to adjust the amount of thermal energy generated by the heater so as to perform the correct soldering process on the basis of the judgment result. This makes it possible to perform the correct soldering process, and to reduce the total number of products having a soldering defect.

What is claimed is:

1. A sleeve soldering device performing a soldering process of a terminal of an electronic component and a terminal of an electric board, comprising:
    a sleeve having a through hole through which a solder is passed, the sleeve providing thermal energy when being in contact with the electric board, and feeding the solder to a soldering part at which the terminal of the electronic component and the terminal of the electric board are soldered together;
    a heater generating thermal energy and heating the sleeve by the generated thermal energy;
    a movement mechanism moving the sleeve heated by the thermal energy generated by the heater when the sleeve is in contact with and pressed to the electric board;
    a detection part detecting at least one of a physical quantity related to a pressure from the sleeve to the electric board when the sleeve presses the electric board, a physical quantity related to a heat transfer amount of thermal energy generated by the heater supplied to the electric board when the sleeve presses the electric board, and a physical quantity related to a deformation amount of the electric board due to the thermal energy generated by the heater; and
    a judgment part judging whether a detection value of the physical quantity detected by the detection part is within a predetermined range defined by an upper threshold and a lower threshold, each of the upper threshold and the lower threshold being determined according to a variation of the physical quantity corresponding to an elapse of time.

2. The sleeve soldering device according to claim 1, wherein
    the detection part detects the physical quantity related to the pressure from the sleeve to the electric board and the physical quantity related to the heat transfer amount of thermal energy generated by the heater supplied to the electric board.

3. The sleeve soldering device according to claim 1, further comprising a spring supporting an assembly structure comprising the sleeve, wherein
    the movement mechanism presses the sleeve onto the electric board while the spring supports the assembly structure, and
    the detection part detects a change amount in length of the spring so as to obtain the physical quantity related to the pressure from the sleeve to the electric board.

4. The sleeve soldering device according to claim 1, wherein
    the detection part detects a heat flux amount of thermal energy generated by the heater supplied from the sleeve to the electric board.

5. The sleeve soldering device according to claim 1, wherein
    the detection part detects a displacement amount of the sleeve in an axial direction of the sleeve as the physical quantity related to the deformation amount of the electric board due to the thermal energy generated by the heater.

6. The sleeve soldering device according to claim 1, wherein
    the detection part repeatedly detects the physical quantity related to the pressure from the sleeve to the electric board,
    the judgment part repeatedly detects whether a detection value as the physical quantity detected by the detection part is within the predetermined range, and
    the sleeve soldering device further comprises a control part, wherein
    when a detection result of the judgment part indicates that the detection value is not within the predetermined range, the control part instructs the movement mechanism so as to adjust a pressure from the sleeve to the electric board so that a following detection value detected by the detection part is within the predetermined range.

7. The sleeve soldering device according to claim 1, wherein the detection part repeatedly detects the physical quantity related to the heat transfer amount of thermal energy generated by the heater supplied to the electric board, the judgment part repeatedly detects whether a detection value as the physical quantity detected by the detection part is within the predetermined range, and the sleeve soldering device further comprises a control part, wherein when a detection result of the judgment part indicates that the detection value is not within the predetermined range, the control part instructs the heater so as to adjust a pressure from the sleeve to the electric board so that a following detection value detected by the detection part is within the predetermined range.

8. A computer implemented method of manufacturing an electronic device composed of an electronic component and an electric board, the method performing a soldering process between a terminal of the electronic component and a terminal of the electric board sleeve by using a sleeve soldering device comprising a sleeve in which a through hole is formed, a movement mechanism and a heater heating the sleeve, wherein a solder is fed into the through hole of the sleeve, the movement mechanism moves the sleeve, the computer implemented method performing:

a movement step which moves the sleeve by the movement mechanism to the electric board so as to press the sleeve heated by thermal energy generated by the heater to the electric board;

a solder feeding step which feeds a solder to a soldering part between the terminal of the electronic component and the terminal of the electric board through the through hole formed in the sleeve while the sleeve is pressed to the electric board;

a detection step which obtains a detection value detected by a detection part related to at least one of:

a physical quantity related to a pressure from the sleeve to the electric board when the sleeve heated by thermal energy generated by the heater is pressed to the electric board, a physical quantity related to a heat flux amount supplied from the heater to the electric board through the sleeve when the sleeve heated by thermal energy generated by the heater is pressed to the electric board, and a physical quantity related to a deformation amount of the electric board due to the thermal energy generated by the heater; and performing a judgment step judging whether the detection value is within a predetermined range defined by an upper threshold and a lower threshold, each of the upper threshold and the lower threshold being determined according to a variation of the physical quantity corresponding to an elapse of time.

9. The computer implemented method according to claim 8, wherein in the detection step, the detection part detects the physical quantity related to the pressure from the sleeve to the electric board and the physical quantity related to the heat transfer amount of thermal energy generated by the heater supplied to the electric board.

10. The computer implemented method according to claim 8, wherein the sleeve soldering device used in the method comprises a spring for supporting an assembly structure comprising the sleeve, and in the movement step, the movement mechanism presses the sleeve onto the electric board while the spring supports the assembly structure, and in the detection step, the detection part detects a change amount in length of the spring so as to obtain the physical quantity related to the pressure from the sleeve to the electric board.

11. The computer implemented method according to claim 8, wherein in the detection step, the detection part detects a heat flux amount of thermal energy generated by the heater supplied from the sleeve to the electric board.

12. The computer implemented method according to claim 8, wherein in the detection step, the detection part detects a displacement amount of the sleeve in an axial direction of the sleeve as the physical quantity related to the deformation amount of the electric board due to the thermal energy generated by the heater.

13. The computer implemented method according to claim 8, wherein in the detection step, the detection part repeatedly detects the physical quantity related to the pressure from the sleeve to the electric board, the judgment step repeatedly obtains a detection value related to the physical quantity detected by the detection part, and repeatedly detects whether the detection value is within the predetermined range, and when a detection result of the judgment step indicates that the detection value is not within the predetermined range, a behavior of the movement mechanism is adjusted to adjust a pressure from the sleeve to the electric board so that a following detection value detected by the detection part is within the predetermined range.

14. The computer implemented method according to claim 8, wherein in the detection step, the detection part repeatedly detects the physical quantity related to the heat transfer amount of the sleeve to the electric board, the judgment step repeatedly obtains a detection value related to the physical quantity detected by the detection part, and repeatedly detects whether the detection value is within the predetermined range, and when a detection result of the judgment step indicates that the detection value is not within the predetermined range, a behavior of the heater is adjusted to adjust the heat flux amount of the heater so that a following detection value detected by the detection part is within the predetermined range.

* * * * *